United States Patent
Roh et al.

(10) Patent No.: US 10,334,569 B2
(45) Date of Patent: Jun. 25, 2019

(54) NLOS WIRELESS BACKHAUL DOWNLINK COMMUNICATION

(71) Applicant: TEXAS INSTRUMENTS INCORPORATED, Dallas, TX (US)

(72) Inventors: June Chul Roh, Allen, TX (US); Pierre Bertrand, Antibes (FR); Srinath Hosur, Plano, TX (US); Vijay Pothukuchi, Allen, TX (US); Mohamed Farouk Mansour, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 450 days.

(21) Appl. No.: 14/297,145

(22) Filed: Jun. 5, 2014

(65) Prior Publication Data
US 2014/0362701 A1 Dec. 11, 2014

Related U.S. Application Data

(60) Provisional application No. 61/831,214, filed on Jun. 5, 2013, provisional application No. 61/831,217, filed
(Continued)

(51) Int. Cl.
| | |
|---|---|
| *H04W 72/04* | (2009.01) |
| *H03M 13/15* | (2006.01) |
| *H03M 13/00* | (2006.01) |
| *H04L 1/00* | (2006.01) |
| *H03M 13/29* | (2006.01) |
| *H04L 1/18* | (2006.01) |
| *H04H 20/38* | (2008.01) |

(52) U.S. Cl.
CPC ... *H04W 72/0413* (2013.01); *H03M 13/1515* (2013.01); *H03M 13/2966* (2013.01);
(Continued)

(58) Field of Classification Search
CPC .............. H04L 1/0076; H03M 13/611; H03M 13/2966
See application file for complete search history.

(56) References Cited

U.S. PATENT DOCUMENTS

| | | | |
|---|---|---|---|
| 2007/0064669 A1* | 3/2007 | Classon ................ | H04L 1/1822 370/347 |
| 2009/0201838 A1* | 8/2009 | Zhang .................. | H04B 7/2656 370/280 |

(Continued)

OTHER PUBLICATIONS

LTE specification TS 136 211 v10, LTE; Evolved Universal Terrestrial Radio Access (E-UTRA); Physical channels and modulation, 2011.*

(Continued)

*Primary Examiner* — Zhensheng Zhang
(74) *Attorney, Agent, or Firm* — Ebby Abraham; Charles A. Brill; Frank D. Cimino

(57) ABSTRACT

A method for communicating over a wireless backhaul channel comprising generating a radio frame comprising a plurality of time slots, wherein each time slot comprises a plurality of symbols in time and a plurality of sub-carriers in a system bandwidth, broadcasting a broadcast channel signal comprising a transmission schedule to a plurality of remote units in a number of consecutive sub-carriers centered about a direct current (DC) sub-carrier in at least one of the time slots in the radio frame regardless of the system bandwidth, and transmitting a downlink (DL) control channel signal and a DL data channel signal to a first of the remote units, wherein the DL data channel signal is transmitted by employing a single carrier block transmission scheme comprising a Discrete Fourier Transform (DFT) spreading for frequency diversity.

24 Claims, 18 Drawing Sheets

Related U.S. Application Data on Jun. 5, 2013, provisional application No. 61/831,229, filed on Jun. 5, 2013.

(52) U.S. Cl.
CPC ......... *H03M 13/611* (2013.01); *H04L 1/0041* (2013.01); *H04L 1/0057* (2013.01); *H04L 1/0061* (2013.01); *H04L 1/0064* (2013.01); *H04L 1/0071* (2013.01); *H04L 1/0076* (2013.01); *H04L 1/1812* (2013.01); *H03M 13/618* (2013.01); *H03M 13/635* (2013.01); *H04H 20/38* (2013.01); *H04W 72/0446* (2013.01)

(56) References Cited

U.S. PATENT DOCUMENTS

| | | | | |
|---|---|---|---|---|
| 2011/0007695 A1* | 1/2011 | Choi | ............ | H04L 5/0007 370/329 |
| 2011/0014911 A1* | 1/2011 | Baldemair | ............ | H04B 7/2606 455/434 |
| 2011/0134874 A1* | 6/2011 | Nakao | ............ | H04L 5/0094 370/329 |
| 2012/0002591 A1* | 1/2012 | Noh | ............ | H04B 7/15557 370/315 |
| 2013/0201925 A1* | 8/2013 | Li | ............ | H04L 27/2646 370/329 |
| 2014/0044104 A1* | 2/2014 | Kim | ............ | H04L 5/0048 370/336 |
| 2014/0064067 A1* | 3/2014 | Drewes | ............ | H04L 5/0044 370/230 |

OTHER PUBLICATIONS

LTE overview, LTE FDD, TDD, TD-LTE Duplex Schemes, online publication, May 2013.*

F. Rayal, An overview of the LTE physical layerPart II, EE/Times, desgnlines wireless & networking, Jun. 20, 2010.*

* cited by examiner

| SLOT CONFIGURATION | SLOT NUMBER IN 10 ms FRAME | | | | | | | | | | | | | | | | | | | | DL RATIOS | UL RATIOS |
|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | | |
| 0 | D | D | S | U | U | U | U | U | U | U | D | D | S | U | U | U | U | U | U | U | 26% | 74% |
| 1 | D | D | S | U | U | U | U | U | U | D | D | D | S | U | U | U | U | U | U | D | 32% | 68% |
| 2 | D | D | S | U | U | U | U | U | D | D | D | D | S | U | U | U | U | U | D | D | 37% | 63% |
| 3 | D | D | S | U | U | U | U | D | D | D | D | D | S | U | U | U | U | D | D | D | 42% | 58% |
| 4 | D | D | S | U | U | U | D | D | D | D | D | D | S | U | U | U | D | D | D | D | 47% | 53% |
| 5 | D | D | S | U | U | D | D | D | D | D | D | D | S | U | U | D | D | D | D | D | 53% | 47% |
| 6 | D | D | S | U | D | D | D | D | D | D | D | D | S | U | D | D | D | D | D | D | 58% | 42% |
| 7 | D | D | S | D | D | D | D | D | D | D | D | D | S | D | D | D | D | D | D | D | 63% | 37% |
| 8 | D | D | S | D | D | D | D | D | D | D | D | D | S | D | D | D | D | D | D | D | 68% | 32% |
| 9 | D | D | S | D | D | D | D | D | D | D | D | D | S | D | D | D | D | D | D | D | 74% | 26% |
| 10 | D | D | S | D | D | D | D | D | D | D | D | D | S | D | D | D | D | D | D | D | 79% | 21% |
| 11 | D | D | S | D | D | D | D | D | D | D | D | D | S | D | D | D | D | D | D | D | 84% | 16% |
| 12 | D | D | S | D | D | D | D | D | D | D | D | D | S | D | D | D | D | D | D | D | 89% | 11% |

NLOS WIRELESS BACKHAUL DOWNLINK COMMUNICATION

CROSS-REFERENCE TO RELATED APPLICATION

The present application claims priority to U.S. Provisional Patent Application 61/831,214, filed Jun. 5, 2013 by June Chul Roh, et. al., and entitled "DATA TRANSMISSION AIR-INTERFACE FOR NLOS WIRELESS BACKHAUL SYSTEMS", U.S. Provisional Patent Application 61/831,217, filed Jun. 5, 2013 by June Chul Roh, et. al., and entitled "DOWNLINK OF NLOS WIRELESS BACKHAUL SYSTEMS", and U.S. Provisional Patent Application 61/831,229, filed Jun. 5, 2013 by June Chul Roh, et. al., and entitled "UPLINK OF NLOS WIRELESS BACKHAUL SYSTEMS", all which are incorporated herein by reference as if reproduced in their entirety.

BACKGROUND

A radio access network (RAN) refers to a network between mobile devices (e.g. mobile phones, personal digital assistants (PDAs), laptops, or any user equipment) and a core network. For example, an area may be divided geographically into a plurality of cells and/or cell sectors, where each cell and/or cell sector may be served by a wireless base station communicating to the core network. Wireless backhaul may refer to the part of the RAN from the wireless base station to the core network. Some wireless backhaul links may be configured for point-to-point (P2P) line-of-sight (LOS) channels (e.g. at about six to about forty-two gigahertz (GHz) microwave frequency band). Thus, such wireless backhaul links may employ single carrier waveforms for transmission and time-domain equalization (TDE) techniques at the receivers. However, in order to meet the growing demand for voice and/or data services over RAN, cell density may be increased, for example, by adding small cells in the neighborhood of macro cells. As such, the density of the associated backhaul links may increase and the P2P LOS wireless backhaul communication mechanisms may not be suitable.

SUMMARY

A non-line-of-sight (NLOS) wireless backhaul downlink communication is disclosed herein. In one embodiment, a method for communicating over a wireless backhaul channel includes generating a radio frame comprising a plurality of time slots, wherein each time slot comprises a plurality of symbols in time and a plurality of sub-carriers in a system bandwidth. The radio frame comprises an adjustable link directionality ratio of a number of the time slots for an uplink (UL) direction and the number of time slots for a downlink (DL) direction to provide traffic load balancing. The method further includes broadcasting a broadcast channel signal to a plurality of remote units in a number of consecutive sub-carriers centered about a direct current (DC) sub-carrier in at least one of the time slots in the radio frame regardless of the system bandwidth. The broadcast channel signal comprises a transmission schedule comprising slot assignments that indicate a link direction and a transmission opportunity for a first of the plurality of remote units. The method further includes transmitting a DL control channel signal and a DL data channel signal to the first remote unit, wherein the DL control channel signal comprises DL control information that controls transmission of the DL data channel signal. The broadcast channel signal, the DL control channel signal, and the DL data channel signal are transmitted by employing a time-frequency multiplex scheme. The DL data channel signal is transmitted by employing a single carrier block transmission scheme comprising a Discrete Fourier Transform (DFT) spreading for frequency diversity.

In another embodiment, an apparatus includes a processing resource and a radio front end interface. The processing resource is configured to perform single carrier modulation on a plurality of data bit streams to generate a plurality of Single Carrier-Frequency Division Multiple Access (SC-FDMA) frames. To perform the single carrier modulation on each data bit stream, the processing resource is further configured to perform symbol mapping on each data bit stream to generate a plurality of modulated data symbols and to perform DFT precoding on the modulated data symbols. The processing resource is further configured to perform frequency-time multiplexing to combine at least one of the SC-FDMA frames with an Orthogonal Frequency Division Multiplexing (OFDM) frame to generate a digital radio frame. The radio front end interface is coupled to the processing resource and configured to cause the digital radio frame to be transmitted to a wireless backhaul remote unit.

In yet another embodiment, a wireless backhaul communication system includes a transmitter comprising a Reed Solomon (RS) encoder configured to perform RS encoding on a DL data bit stream to generate a plurality of RS codewords, a byte interleaver coupled to the RS encoder and configured to perform byte interleaving across the plurality of RS codewords, and a Turbo encoder coupled to the byte interleaver and configured to perform Turbo encoding on the interleaved RS codewords to generate one or more Turbo codewords. Each Turbo codeword is encoded from multiple RS codewords. The transmitter further includes a symbol mapper coupled to the Turbo encoder and configured to modulate and DFT precode the Turbo codewords, a transmission control frame, and a broadcast frame separately. The broadcast frame comprises a transmission schedule for a plurality of wireless backhaul remote units. The transmitter further includes a sub-carrier mapper coupled to the symbol mapper and configured to generate a digital radio frame comprising a plurality of symbols in time and a plurality of sub-carriers in a system bandwidth. To generate the digital radio frame, the sub-carrier mapper is to further configure to map the DFT precoded broadcast frame onto a first set of the sub-carriers centered about a DC sub-carrier. The first set of sub-carriers comprises a fixed number of consecutive sub-carriers regardless of the system bandwidth. The sub-carrier mapper is further configured to map the DFT precoded transmission control frame onto a second set of the sub-carriers near a lower frequency edge and near a higher frequency edge of the system bandwidth and map the DFT precoded Turbo codewords onto frequency sub-carriers different than the first set of sub-carriers and the second set of sub-carriers. The wireless backhaul communication system further includes a radio front end comprising an antenna and coupled to the transmitter. The radio front end is configured to convert the digital radio frame to an analog signal and transmit the analog signal via the antenna.

BRIEF DESCRIPTION OF THE DRAWINGS

For a detailed description of exemplary embodiments of the invention, reference will now be made to the accompanying drawings in which:

FIG. 17 shows a table of UL-DL slot configurations and corresponding DL ratios and UL ratios in accordance with various embodiments;

DETAILED DESCRIPTION

Figure 1:
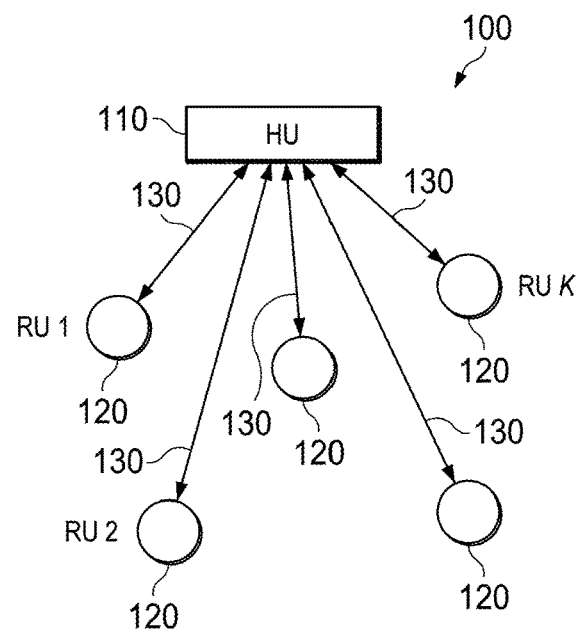
FIG. 1 shows a block diagram of a point-to-multi-point (P2MP) backhaul system in accordance with various embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In a RAN, mobile devices may connect to a core network via a plurality of links. For example, a first link (e.g. a mobile access channel, such as a Long Term Evolution (LTE) communication channel) may be between the mobile devices and a wireless base station serving a cell that covers the location of the mobile devices, a second link (e.g. a wireless backhaul channel) may be between the wireless base station (e.g. comprising a wireless backhaul remote unit (RU)) and a wireless backhaul hub (HU), and a third link may be between the wireless backhaul hub and the core network. As the tendency in RAN topology is to increase cell density by adding a plurality of small cells in the neighborhood of macro cells, the density of the associated backhaul links may increase. The densely populated small cell backhauls may lead to NLOS backhaul channels. As such, the differences between mobile access channels and wireless backhaul channels may decrease as the backhaul link density increases. Thus, NLOS wireless backhaul communication may employ a substantially similar point-to-multi-point (P2MP) topology and air-interface mechanisms as in the mobile access channels. However, wireless backhaul may require some different features from the mobile access. For example, wireless backhaul communication may comprise sparser spectrum availability, tighter latency (e.g. less than about five milliseconds (ms) may be desirable), and steadier operations (e.g. no handover, lower disconnection rate, no mobility support, etc.). In addition, wireless backhaul may support operation at a bit error rate (BER) (e.g. around $10^{-10}$) substantially lower than mobile access channels.

Embodiments of the NLOS wireless backhaul communication disclosed herein include a wireless backhaul radio frame configuration and baseband generation schemes for small cell backhaul. The small cell backhaul may employ a P2MP configuration, for example, one HU communicating to a plurality of RUs located at mobile base stations, each serving a cell and/or a cell sector. The wireless backhaul communication may employ a time division duplex (TDD) scheme for UL and DL transmissions, where a single frequency band (e.g. 5, 10, and/or 20 megahertz (MHz)) may be shared between a UL channel and a DL channel by multiplexing the UL and DL transmissions in a time domain. A radio frame may comprise a predetermined number of sub-carriers (e.g. according to sub-carrier spacing and bandwidth) and may span a pre-determined time interval. In an embodiment, a radio frame may comprise two sub-frames (e.g. half frame), each sub-frame may comprise about ten time slots, and each slot may comprise about seven SC-FDMA symbols in time. In a radio frame, one or more time slots may be assigned to a RU for UL and/or DL transmissions and may vary depending on traffic load. In order to provide low transmission latency for wireless backhaul, a time slot may be configured to be about 0.5 ms duration. In an embodiment, DL transmission may comprise a plurality of physical layer (PHY) channels, such as a physical DL shared channel (PDSCH), a physical DL control channel (PDCCH), a physical hybrid automatic repeat request indicator channel (PHICH), and a physical broadcast channel (PBCH). UL transmission may also comprise a plurality of PHY channels, such as a physical UL shared channel (PUSCH), a physical UL control channel (PUCCH), and a physical random access channel (PRACH). A time slot may carry one or more of the UL PHY channels or DL PHY channels by frequency-time multiplexing. In addition, each radio frame may carry a synchronization sequence (SS) for frame detection and/or synchronization and each time slot may comprise a pilot symbol (PS) for channel estimation and/or frequency and/or timing offset tracking. In an embodiment, a wireless backhaul system may employ SC-FDMA for both UL and/or DL transmissions, where SC-FDMA may provide a substantially lower peak-to-average-power ratio (PAPR) than OFDM. In addition, SC-FDMA may be combined with Orthogonal Frequency Division Multiple Access (OFDMA) through sub-carrier mapping to provide frequency diversity and maintain a substantially low PAPR. The wireless backhaul system may employ a higher-order modulation (e.g. 256 Quadrature Amplitude Modulation (QAM)) to provide higher data rate and a FEC scheme that combines RS encoding as outer code, Turbo encoding as inner code, and a hybrid automatic repeat request (HARQ) scheme to provide a low BER (e.g. about $10^{-10}$).

FIG. 1 shows a block diagram of a P2MP backhaul system 100 in accordance with various embodiments. The system 100 may comprise a HU 110 and a plurality of RUs 120 (e.g. RU 1, RU 2, . . . , RU K) configured in a P2MP configuration. The HU 110 may be communicatively coupled to the RUs 120 via air-interface links 130. The links 130 may comprise wireless NLOS channels. The links 130 may be bi-directional links comprising both UL and DL transmissions, where UL transmissions may refer to transmissions from RUs 120 to HU 110 and DL transmissions may refer to transmissions from HU 110 to RUs 120.

The HU 110 may be a wireless equipped device configured to communicate with a plurality of RUs 120 over the air-interface links 130 for backhaul connectivity and management. The HU 110 may comprise a wireless transceiver or a separate wireless transmitter and receiver with one or more antennas. The HU 110 may be configured to transmit DL radio signals to one or more RU 120s and receive UL radio signals from one or more RUs 120 by employing a SC-FDMA scheme for transmissions in both UL and DL. The HU 110 may employ a TDD scheme for multiplexing UL and DL transmissions in time and a time domain multiple access (TDMA) scheme to schedule transmission in units of time slots for the RUs 120. The HU 110 may provide connectivity between the RUs 120 and a core network (e.g. via a physical link, such as an optic fiber link). The core network may be a mobile operator's network, a packet switched telephone network (PSTN), or a packet switched data network (PSDN). In some embodiments, a HU 110 may serve about four to about eight RUs 120.

The RUs 120 may be a wireless equipped device configured to communicate with a HU 110 over the air-interface links 130. Each RU 120 may comprise a wireless transceiver or a separate wireless transmitter and receiver with one or more antennas and may be configured to transmit UL radio signals to the HU 110 and receive DL radio signals from the HU 110 by employing a SC-FDMA scheme. In some embodiments, the RU 120 may be located in a mobile base station that serves a geographically divided area (e.g. a small cell), where the mobile base station may communicate with a plurality of mobile devices (e.g. mobile phones, laptops, or any mobile user equipment) situated in the served area. In some other embodiments, the RU 120 may be attached or connected with a digital link in a physical location (e.g. a lamp post).

In an embodiment, UL and/or DL transmissions between a HU 110 and RUs 120 may be in terms of radio frames over links 130. A radio frame may span a predetermined system bandwidth, for example, five, ten, or twenty MHz, and a predetermined time interval. For example, a radio frame may comprise a plurality of sub-carriers (e.g. with sub-carrier spacing of about fifteen kilohertz (kHz)) in the frequency domain and about two sub-frames in a time domain. Each sub-frame may comprise about ten time slots and each slot may comprise about seven symbols. HU 110 may assign one or more time slots for a RU 120 in a radio frame and may adjust the switching between UL and DL based on traffic load. HU 110 and RUs 120 may communicate via several UL and DL channels, which may be frequency-time multiplexed in a radio frame and may operate in a TDD mode for DL and UL duplexing. For example, DL PHY channels may comprise a PDSCH for transporting DL data, a PDCCH for transporting physical layer transmission controls, a PBCH for broadcasting system information and/or transmission schedules, and/or a PHICH for transporting HARQ feedbacks for UL transmissions (e.g. reception statuses). UL PHY channels may comprise a PUSCH for transporting UL data, a PUCCH for transporting UL controls and reports (e.g. wide-band Channel Quality Indicator (CQI), Rank Indication (RI), HARQ feedbacks for DL transmissions, etc.), and a PRACH for transporting random access sequences for initial channel access. In addition, each radio frame may carry a SS to allow frame detection and/or frame synchronization at a RU 120 and each time slot may comprise a PS for channel estimation and/or frequency and/or time offset tracking at a HU 110 and/or a RU 120.

Figure 2:
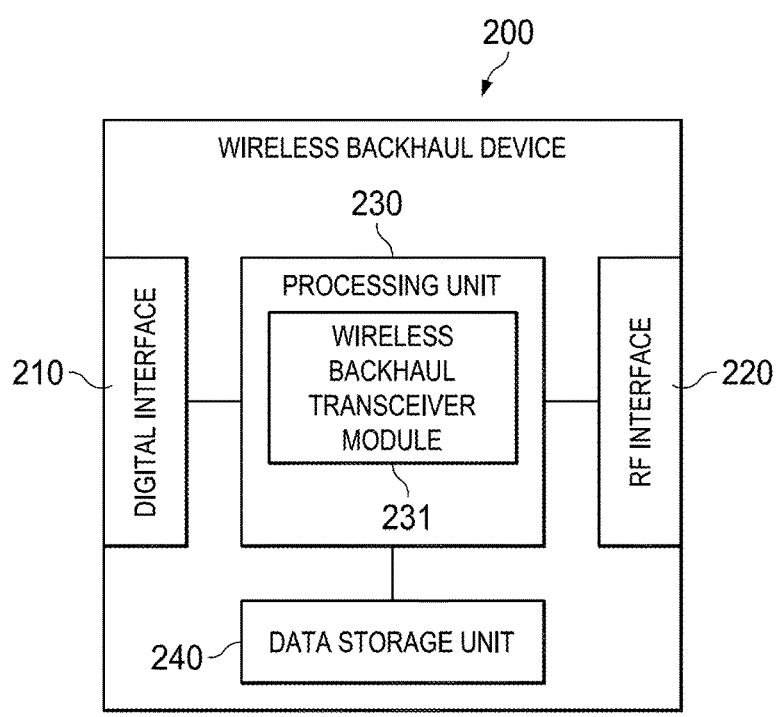
FIG. 2 shows a block diagram of a wireless backhaul device in accordance with various embodiments.

FIG. 2 shows a block diagram of a wireless backhaul device 200 in accordance with various embodiments. Device 200 may act as a HU (e.g. HU 110) or a RU (e.g. RU 120) in a wireless backhaul system (e.g. system 100). As shown in FIG. 2, the device 200 may comprise digital interfaces 210, a processing unit 230, a data storage unit 240, and a radio frequency (RF) interface 220. The digital interfaces 210 may be configured to receive digital data streams from external devices and/or transmit digital data streams to external devices. In some embodiments, digital interfaces 210 may include high speed serializer/de-serializer (SerDes) lanes, external memory interfaces (EMIFs), universal serial bus (USB) interfaces, serial peripheral interfaces (SPIs), universal asynchronous receive/transmit (UART) interfaces, Integrated-Integrated Circuit interfaces (I2Cs), general purpose digital Input/Outputs (GPIOs), etc.

A processing unit 230 may be coupled to the digital interface 210 to process the data streams received from the digital interface 210 or generate and transmit data streams to the digital interface 210. The processing unit 230 may comprise one or more processors (e.g., single or multi-core processors, a digital signal processor, etc.), one or more hardware accelerators, one or more computers, and/or data storage unit 240, which may function as data stores, buffers, etc.

In some embodiments, the processing unit 230 may include a plurality of hardware accelerators designed specifically for wireless backhaul communication. Some examples of hardware accelerators may include Turbo encoding and/or decoding, Viterbi decoding, bit rate processing, Fast Fourier Transform (FFT), digital down and/or up conversions (DDUC), crest factor reduction (CFR), digital pre-distortion (DPD), packet processing, security processing, etc.

The processing unit 230 may comprise a wireless backhaul transceiver module 231 stored in internal non-transitory memory in the processing unit 230 to permit the processing unit 230 to implement a baseband transmit chain, such as transmitter 300, 400, 500, 600, and/or 700, methods 1600 and/or 1700, a baseband receiving chain, and/or any other schemes as discussed herein. In an alternative embodiment, the wireless backhaul transceiver module 231 may be implemented as instructions stored in the data storage unit 240, which may be executed by the processing unit 230.

The data storage unit 240 may comprise one or more caches (e.g. level one (L1), level two (L2), and/or level three (L3) caches) for temporarily storing content, e.g., a Random Access Memory (RAM). Additionally, the data storage unit 240 may comprise a long-term storage for storing content relatively longer, e.g., a Read Only Memory (ROM). For instance, the cache and the long-term storage may include dynamic random access memories (DRAMs), double data rate 3 (DDR3) RAMs and/or synchronous dynamic random access memories (SDRAMs), solid-state drives (SSDs), hard disks, combinations thereof, or other types of non-transitory storage devices.

The radio frequency (RF) interface 220 may be coupled to the processing unit 230 and a radio front end. For example, the radio front end may comprise one or more antennas and may be configured to receive and/or transmit radio signals wirelessly. The RF interface 220 may be configured to receive digital frames generated by the processing unit 230 and transmit the received digital frames to the radio front end. Conversely, the RF interface 220 may be configured to receive digital frames converted by the radio front end (e.g. from received radio signals) and transmit the received digital frames to the processing unit 230 for processing.

In some embodiments, device 200 may further comprise a power management system, an Ethernet packet switch (e.g. 1 gigabit (G) switch), and/or other system components and may be alternatively configured as determined by a person of ordinary skill in the art to achieve the same functionalities.

Figure 3:
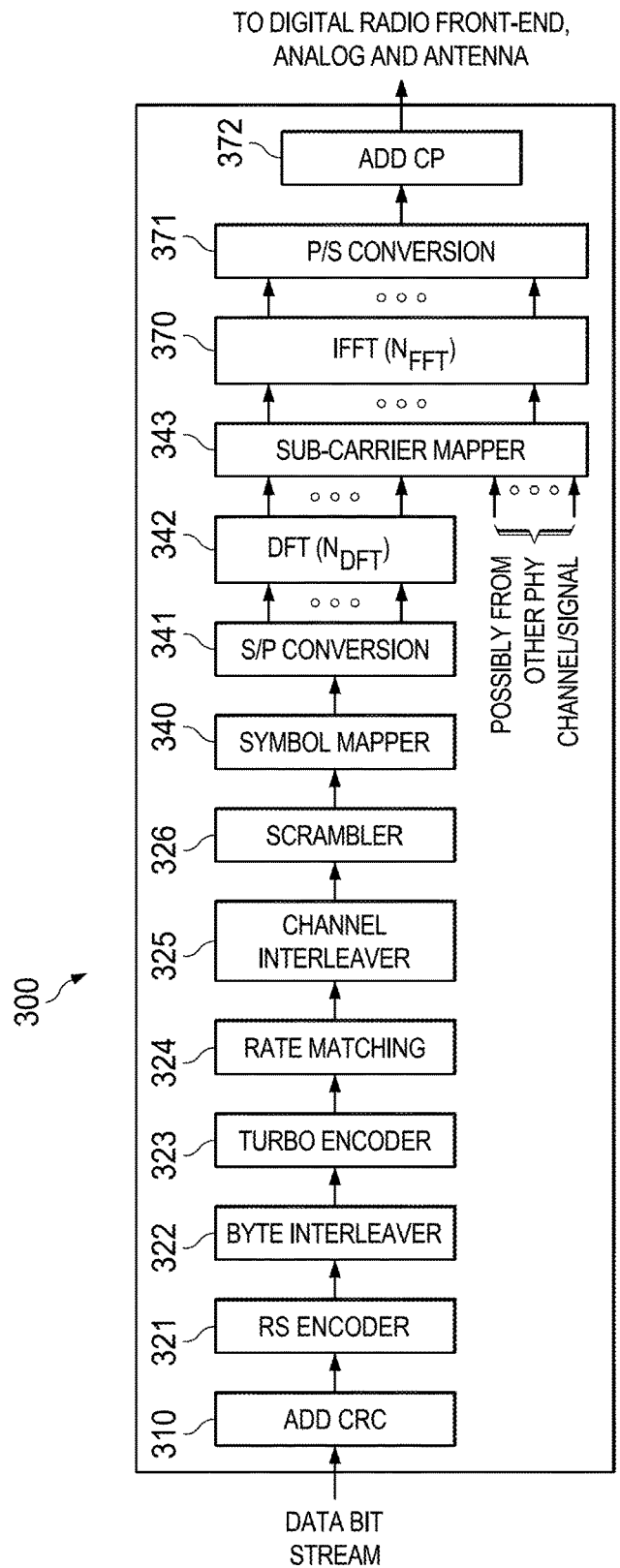
FIG. 3 shows a block diagram of a transmitter for single antenna transmission in accordance with various embodiments.

FIG. 3 shows a block diagram of a transmitter 300 for single antenna transmission in accordance with various embodiments. Transmitter 300 may be employed for generating baseband signals for DL transmissions at a HU (e.g. HU 110) or UL transmissions at a RU (e.g. HU 120) in a wireless backhaul system (e.g. system 100) with a single antenna. For example, transmitter 300 may generate baseband signals for UL or DL data channels (e.g. PUSCH or PDSCH). Transmitter 300 may be implemented in a processing unit (e.g. processing unit 230), which may comprise one or more application specific integrated circuits (ASICs), digital signal processors (DSPs), and/or hardware accelerators.

Transmitter 300 may comprise an add Cyclic Redundancy Check (CRC) 310 component, a RS encoder 321, a byte interleaver 322, a Turbo encoder 323, a rate matching 324 component, a channel interleaver 325, and a scrambler 326. The transmitter 300 may be configured to receive an input data bit stream for transmission. The transmitter 300 may process the input data bit stream in units of Media Access Control (MAC) layer transport block (TB). For example, the add CRC 310 component may be configured to compute a CRC (e.g. according to a selected CRC generator polynomial such as CRC-24) for a MAC TB and may attach the CRC to the end of the MAC TB.

The RS encoder 321 may be coupled to the output of the add CRC 310 component and may be configured to perform RS encoding to generate one or more RS codewords. For example, a RS(255, 255-2T) encoding may be employed, where T (e.g. T may be about three or about four) may represent the error correction capability (e.g. in bytes) of the RS code. Alternatively, a shortened RS code in the form of RS(255-S, 255-2T-S) (e.g. RS(192, 184), RS(128,122), etc.) may be employed, where S may represent the number of RS symbols for shortening. The byte interleaver 322 may be coupled to the output of the RS encoder 321 and configured to perform byte interleaving across one or more RS codewords to generate an interleaved frame. The Turbo encoder 323 may be coupled to the output of the RS encoder 321 and may comprise a parallel concatenated convolutional code (PCCC) generator and an internal interleaver. The Turbo encoder 323 may be configured to perform Turbo encoding to generate one or more Turbo code blocks. In an embodiment, the interleaved frame may be segmented into a plurality of interleaved sub-frames, which may be input to the Turbo encoder 323 such that the byte interleaving may span across one or more Turbo code blocks.

It should be noted that the structure of the RS encoder 321, the byte interleaver 322, and the Turbo encoder 323 may be referred to as a FEC encoder, where a FEC codeword may comprise one or more Turbo code blocks and each Turbo code block may be generated from multiple RS codewords as discussed more fully herein below. The concatenated RS and Turbo encoding FEC encoder may be suitable for providing error correction capabilities against random and/or bursty channel errors. In some embodiments, a CRC may be added to each FEC codeword (e.g. RS and Turbo encoded). In some other embodiments, a CRC may be added to each Turbo code block. In addition, a MAC TB with CRC attachment may be encoded into an integer number of FEC codewords (e.g. applying concatenated Turbo and RS codes) discussed more fully below.

The rate matching 324 component may be coupled to the output of the Turbo encoder 323 and may be configured to adjust code rate to match a selected transmission rate. The channel interleaver 325 may be coupled to the output of the rate matching 324 component and may be configured to perform interleaving, for example, by interleaving the output of the rate matching 324 component in units of words, where the number of bits in each word may correspond to a number of bits in a modulation symbol for a selected modulation scheme (e.g. four bits for 16-QAM, six bits for 64-QAM, eight bits for 256-QAM, etc.). Interleaving may be performed by filling symbols into a matrix by row and then outputting the symbols in the matrix by column. In an embodiment, the channel interleaver 325 may perform interleaving across a number of words that corresponds to the number of sub-carriers in about two SC-FDMA symbols. It should be noted that the interleaving matrix may be configured with various dimensions as determined by a person of ordinary skill in the art to achieve the same functionalities. The scrambler 326 may be coupled to the output of the channel interleaver 325 and may be configured to perform bit-level scrambling according to a selected scrambling sequence.

The transmitter 300 may further comprise a symbol mapper 340, a serial-to-parallel (S/P) conversion 341 component, a DFT 342 component, and a sub-carrier mapper 343. The symbol mapper 340 may be coupled to the output of the scrambler 326 and may be configured to map the scrambled data bits into modulation symbols according to a selected modulation coding scheme (MCS) (e.g. 4, 16, 64, 256-QAM), which may be selected to adapt to channel conditions (e.g. a higher order MCS for a higher signal-to-noise ratio (SNR) channel). The S/P conversion 341 component may be coupled to the output of the symbol mapper 340 and may be configured to convert the modulated symbols into parallel outputs, which may be inputted into the DFT 342 component. The DFT 342 component may be configured to transform the modulated symbols from a time domain into a frequency domain, where such DFT operation may be referred to as DFT precoding and/or DFT-spreading and may provide frequency diversity gain in a frequency selective channel. The sub-carrier mapper 343 may be coupled to the output of the DFT 342 component and may be configured to map the DFT outputs onto a plurality of sub-carriers. In some embodiments, the DFT outputs may be mapped to a group of consecutive sub-carriers that span a portion of the system bandwidth or a full system bandwidth. In some other embodiments, the DFT outputs may be mapped to multiple separated portions of the system bandwidth (e.g. near a higher frequency edge or near a lower frequency edge of the system bandwidth). It should be noted that the sub-carrier mapping may be alternatively grouped and/or distributed as determined by a person of ordinary skill in the art to achieve the same functionalities.

The transmitter 300 may further comprise an Inverse Fast Fourier Transform (IFFT) 370 component, a parallel-to-serial (P/S) conversion 371 component, and an add cyclic prefix (CP) 372 component. The IFFT 370 component may be coupled to the output of the sub-carrier mapper 343 and may be configured to transform the sub-carriers into time domain samples. In some embodiments, the IFFT 370 component may be configured with an additional frequency shift (e.g. or via a frequency shifter) of about half a sub-carrier without a phase reset after the frequency shift (e.g. after each SC-FDMA symbol). The P/S conversion 371 component may be coupled to the output of the IFFT 370 component and may be configured to convert the IFFT outputs into a block of samples. The add CP 372 component may be coupled to the output of the P/S conversion 371 component and may be configured to copy a portion of the time domain samples at the end of the block (e.g. IFFT outputs) to the beginning. The output at the add CP 372 component may be in terms of SC-FDMA symbols. The SC-FDMA symbols may be transmitted to a radio front end, which may convert the SC-FDMA symbol (e.g. digital time samples) into an analog RF signal and may transmit the RF signal with a single antenna into air-interface links (e.g. links 130). It should be noted that the structure of transmitter 300 comprising a symbol mapper 340, followed by the DFT 342 component, followed by the sub-carrier mapper 343 and the IFFT 370 component may be referred to as a SC-FDMA transmitter. SC-FDMA transmission scheme may lead to a single-carrier transmit signal with low PAPR, in contrast to OFDMA, which may be a multiple carriers signal with higher PAPR.

In some embodiments, transmitter 300 may combine SC-FDMA transmission with OFDM transmission. For example, the sub-carrier mapper 343 may be additionally coupled to other transmission blocks (e.g. encoding and/or modulation blocks) that generate data for different channels (e.g. control channels) by employing an OFDMA transmission scheme. In such embodiments, each channel may be mapped to one or more groups of consecutive sub-carriers, for example, located at the edges (e.g. near a lower frequency edge and near a higher frequency edge) of the system bandwidth or in the middle of the system bandwidth.

Figure 4:
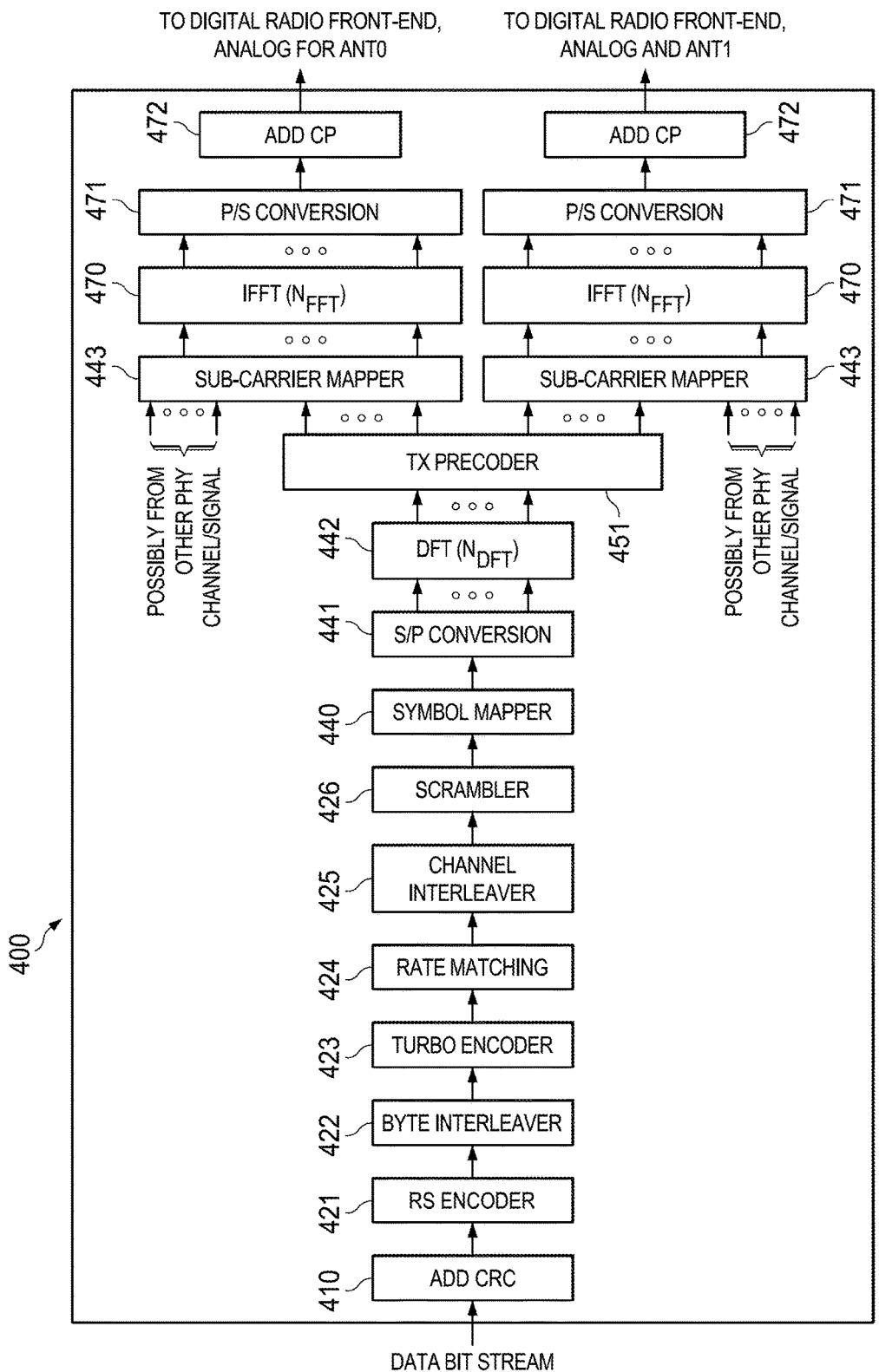
FIG. 4 shows a block diagram of a transmitter for rank-1 transmission in accordance with various embodiments.

FIG. 4 shows a block diagram of a transmitter 400 for rank-1 transmission in accordance with various embodiments. Transmitter 400 may be employed for generating baseband signals for DL transmissions at a HU (e.g. HU 110) or UL transmissions at a RU (e.g. HU 120) in a wireless backhaul system (e.g. system 100) with multiple antennas (e.g. about two antennas or about four antennas) for rank-1 transmission. Transmitter 400 may provide improved system performance (e.g. reduced BER) through space-frequency transmit diversity when compared to a single antenna transmitter (e.g. transmitter 300). For example, transmitter 400 may generate baseband signals for UL and/or DL data channels (e.g. PUSCH and/or PDSCH). Transmitter 400 may be implemented in a processing unit (e.g. processing unit 230), which may comprise one or more ASICs, DSPs, and/or hardware accelerators. Transmitter 400 may comprise an add CRC 410 component, a RS encoder 421, a byte interleaver 422, a Turbo encoder 423, a rate matching 424 component, a channel interleaver 425, a scrambler 426, a symbol mapper 440, an S/P conversion 441 component, and a DFT 442 component, which may be substantially similar to add CRC 310 component, RS encoder 321, byte interleaver 322, Turbo encoder 323, rate matching 324 component, channel interleaver 325, scrambler 326, symbol mapper 340, S/P conversion 341 component, and DFT 342 component, respectively. However, transmitter 400 may further comprise an additional transmit (Tx) precoder 451 coupled to the output of the DFT 442 component.

The Tx precoder 451 may be configured to encode the DFT outputs into two output streams by employing a space-frequency block coding (SFBC) scheme (e.g. space frequency Alamouti code) or other precoding scheme for transmission with multiple antennas (e.g. about two antennas or about four antennas). Transmitter 400 may further comprise two processing chains coupled to the output of the Tx precoder 451 and may be configured to process the two precoded streams independently. Each processing chain may comprise a separate sub-carrier mapper 443, an IFFT 470 component, a P/S conversion 471 component, and an add CP 472 component, which may be substantially similar to sub-carrier mapper 343, IFFT 370 component, P/S conversion 371 component, and add CP 372 component, respectively. The block of output samples generated at the output of each of the add CP 472 components may be transmitted via a separate antenna. In some embodiments, transmitter 400 may combine SC-FDMA transmission with OFDM transmission by employing substantially similar mechanisms as in transmitter 300.

Figure 5:
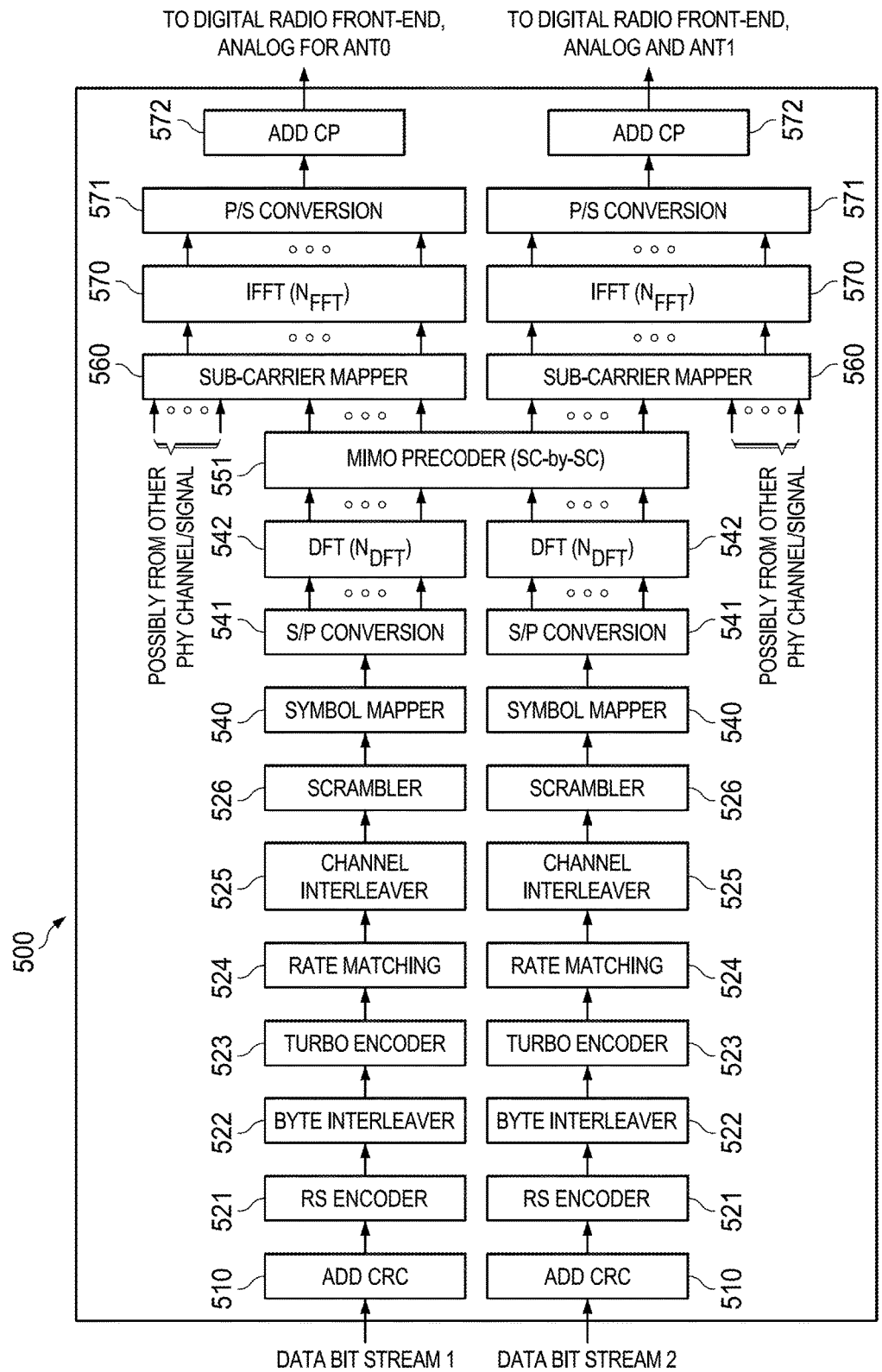
FIG. 5 shows a block diagram of a transmitter for rank-2 transmission in accordance with various embodiments.

FIG. 5 shows a block diagram of a transmitter 500 for rank-2 transmission in accordance with various embodiments. Transmitter 500 may be employed for generating baseband signals for DL transmissions at a HU (e.g. HU 110) or UL transmissions at a RU (e.g. HU 120) in a wireless backhaul system (e.g. system 100) with multiple antennas (e.g. about two antennas or about four antennas) for rank-2 transmission. For example, transmitter 500 may generate baseband signals for UL and/or DL data channels (e.g. PUSCH and/or PDSCH). Transmitter 500 may be implemented in a processing unit (e.g. processing unit 230), which may comprise one or more ASICs, DSPs, and/or hardware accelerators. Transmitter 500 may comprise two separate processing chains with identical structures for bit processing and symbol processing and may encode two separate input data bit streams separately. For example, each transmitter chain may comprise an add CRC 510 component, a RS encoder 521, a byte interleaver 522, a Turbo encoder 523, a rate matching 524 component, a channel interleaver 525, a scrambler 526, a symbol mapper 540, an S/P conversion 541 component, and a DFT 542 component, which may be substantially similar to add CRC 310 component, RS encoder 321, byte interleaver 322, Turbo encoder 323, rate matching 324 component, channel interleaver 325, scrambler 326, symbol mapper 340, S/P conversion 341 component, and DFT 342 component, respectively. Transmitter 500 may further comprise a multiple-input multiple-output (MIMO) precoder 551 component coupled to the outputs of the DFT 542 components.

The MIMO precoder 551 component may be configured to encode the two independent DFT outputs from each of the DFT 542 component into two output streams, for example, via a spatial multiplexing scheme for transmission with two antennas. In an embodiment, MIMO precoding may employ a close loop codebook based method, where a receiver that receives the signal transmitted by the transmitter 500 may provide a suitable precoding matrix (e.g. by indicating a precoding matrix index (PMI) selected from a set of predetermined precoding matrices). In another embodiment, a precoding matrix may be determined by exploiting TDD channel reciprocity, where the precoding matrix may be determined from a received signal at a receiving component of a wireless backhaul unit of the transmitter 500 (e.g. a HU 110 may determine a DL precoding matrix from UL channel estimation). Transmitter 500 may further comprise two processing chains coupled to the output of the MIMO precoder 551 component and configured to process the two MIMO precoded streams independently. Each processing chain may further comprise a sub-carrier mapper 560, an IFFT 570 component, a P/S conversion 571 component, and an add CP 572 component, which may be substantially similar to sub-carrier mapper 343, IFFT 370 component, P/S conversion 371 component, and add CP 372 component, respectively. The block of output samples generated at the output of each of the add CP 572 components may be transmitted via a separate antenna. In some embodiments, transmitter 500 may combine SC-FDMA transmission with OFDM transmission by employing substantially similar mechanisms as in transmitter 300.

It should be noted that transmitters 300, 400, and/or 500 may employ a FEC encoding scheme comprising RS encoding (e.g. RS encoder 321, 421, and/or 521), byte interleaving (e.g. byte interleaver 322, 422, and/or 522), and Turbo encoding (e.g. Turbo encoder 323, 423, and/or 523) to provide a lower BER for backhaul communication. Additional performance improvements may be achieved by employing a HARQ scheme, where a receiver may provide a transmitter with feedbacks on data reception statuses (e.g. positive acknowledgements (ACK) or negative acknowledgements (NAK)) and the transmitter may retransmit a data packet when the receiver fails to receive the data packet successfully (e.g. indicated by a NAK). In some embodiments, a transmitter may manage a plurality of HARQ processes (e.g. different logical channels and/or different receivers) simultaneously and/or may re-transmit data for a number of times.

Figure 6:
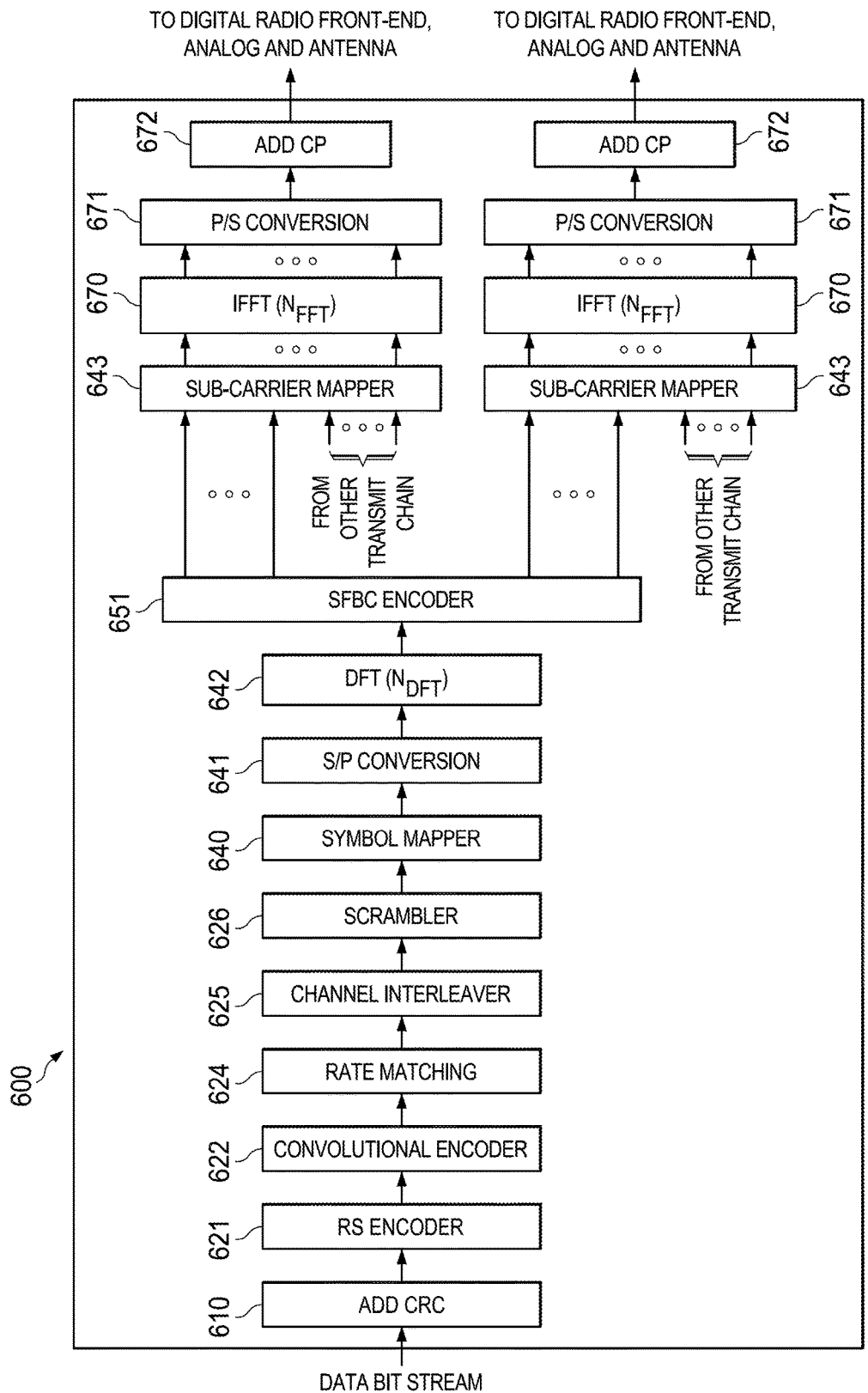
FIG. 6 shows a block diagram of a transmitter for DL non-data channel transmission in accordance with various embodiments.

FIG. 6 shows a block diagram of a transmitter 600 for DL non-data channel transmission in accordance with various embodiments. Transmitter 600 may be employed for generating baseband signals for DL transmissions at a HU (e.g. HU 110) in a wireless backhaul system (e.g. system 100) with multiple antennas (e.g. about two antennas or about four antennas) for rank-1 transmission. For example, transmitter 600 may generate baseband signals for control channels, such as PBCH and/or PDCCH. Transmitter 600 may be implemented in a processing unit (e.g. processing unit 230), which may comprise one or more ASICs, DSPs, and/or hardware accelerators. Transmitter 600 may comprise a substantially similar structure as in transmitter 400, but may employ a different FEC encoding scheme, for example, with RS encoding and/or convolutional encoding. For example, transmitter 600 may comprise an add CRC 610 component, a RS encoder 621, a convolutional encoder 622, a rate matching 624 component, a channel interleaver 625, and a scrambler 626. The add CRC 610 component, the RS encoder 621, the rate matching component 624, the channel interleaver 625, and the scrambler 626 may be substantially similar to add CRC 410 component, RS encoder 421, rate matching 424 component, channel interleaver 425, and scrambler 426, respectively. The convolutional encoder 622 may be configured to perform convolutional encoding, for example, with a constraint length of seven and a code rate of 1/3. In some embodiments, the convolutional encoder 622 may perform convolutional encoding with zero tail bits. In some other embodiments, the convolutional encoder 622 may perform convolutional encoding with tail-biting.

In some embodiments, transmitter 600 may employ both RS encoder 621 and convolutional encoder 622 for FEC encoding or only convolutional encoder 622 depending on the size of an input control frame or control message (e.g. PBCH data or PDCCH data). It should be noted that transmitter 600 may not employ an interleaver between the RS encoder 621 and the convolutional encoder 622 since an input control frame may be encoded into a single RS codeword. In some other embodiments, the RS encoder 621 may be replaced with a Bose-Chaudhuri-Hocquenghem (BCH) encoder.

Transmitter 600 may further comprise a symbol mapper 640, an S/P conversion 641 component, and a DFT 642 component, which may be substantially similar to symbol mapper 440, S/P conversion 441 component, and DFT 442 component, respectively. However, symbol mapper 640 may be configured to employ a fixed MCS that comprises a low modulation order (e.g. Quadrature Phase Shift Keying (QPSK)) to provide robust transmission of control information over noisy channels.

Transmitter 600 may further comprise an SFBC encoder 651 coupled to the output of the symbol mapper 640, where the SFBC encoder 651 may be substantially similar to Tx precoder 451 (e.g. employing an Alamouti SFBC) and may generate two SFBC encoded streams. Transmitter 600 may further comprise two separate processing chains coupled to the output of the SFBC encoder 651 and configured to process the two SFBC encoded streams. Each processing chain may comprise a sub-carrier mapper 660, an IFFT 670 component, a P/S conversion 671 component, and an add CP 672 component, which may be substantially similar to sub-carrier mapper 443, IFFT 470 component, P/S conversion 471 component, and add CP 472 component, respectively.

It should be noted that the DFT precoded modulated symbols at the output of the DFT 642 component may be mapped to one or more groups of sub-carriers over the system bandwidth. For example, when the input data bit stream comprises PBCH data, the DFT output may be mapped to a group of sub-carriers located in the middle of the system bandwidth. When the input data bit stream comprises PDCCH data, the DFT output may be mapped to two groups of sub-carriers local at the edges (e.g. near a higher frequency edge and near a lower frequency edge) of the system bandwidth discussed more fully below. In addition, transmitter 600 may employ a same or a different CRC schemes (e.g. CRC-16 with 16-bits in length) at the add CRC 610 component and/or a same or a different rate matching schemes at the rate matching 624 component for PBCH data and PDCCH data.

Figure 7:
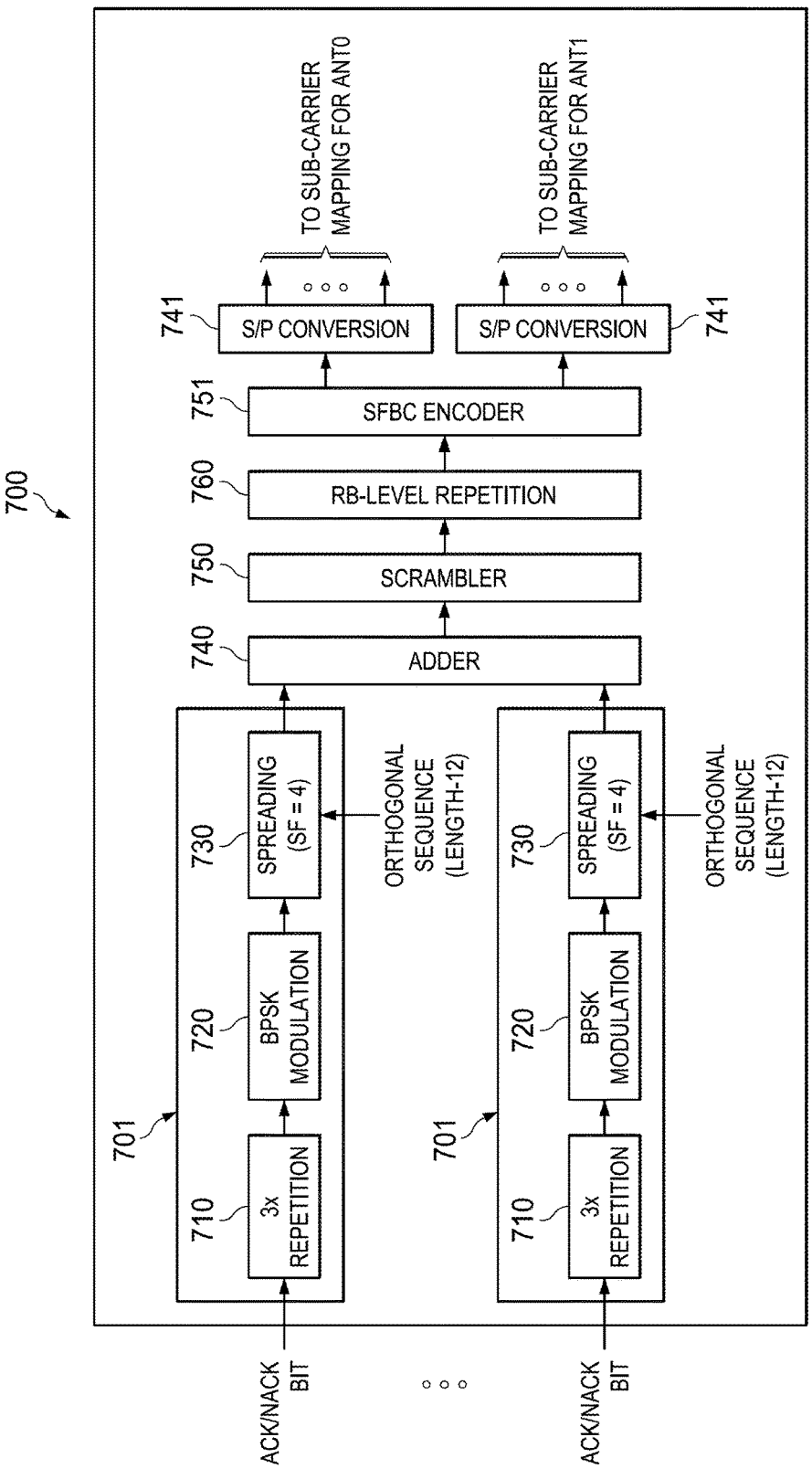
FIG. 7 shows a block diagram of another transmitter for DL non-data channel transmission in accordance with various embodiments.

FIG. 7 shows a block diagram of another transmitter 700 for DL non-data channel transmission in accordance with various embodiments. Transmitter 700 may be employed for generating baseband signals for DL transmissions at a HU (e.g. HU 110) in a wireless backhaul system (e.g. system 100) with two antennas for rank-1 transmission. For example, transmitter 700 may generate baseband signals for a control channel, such as a PHICH (e.g. for HARQ processing). Transmitter 700 may be implemented in a processing unit (e.g. processing unit 230), which may comprise one or more ASICs, DSPs, and/or hardware accelerators. Transmitter 700 may comprise a plurality of processing chains 701, each comprising a repetition 710 component, a Binary Phase Shift Keying (BPSK) modulation 720 component, and a spreading 730 component. Each processing chain may receive one input data bit, which may indicate a positive acknowledgment (ACK) or a negative acknowledgement (NAK) discussed more fully below. The repetition 710 component may repeat the input data bit, for example, for three times. The BPSK modulation 720 component may be coupled to the output of the repetition 710 component and configured to map the repeated data bits into BPSK symbols. The spreading 730 component may be coupled to the output of the BPSK modulation 720 component and configured to perform symbol level spreading (e.g. with a factor of about four) by employing orthogonal sequences (e.g. eight orthogonal sequences with lengths of about twelve in a frequency domain).

Transmitter 700 may further comprise an adder 740 coupled to the outputs of the plurality of processing chains 701. The adder 740 may be configured to add the spread modulation symbols. In some embodiments, the adder 740 may combine up to about eight processing chains 701 (e.g. about eight ACK/NAK bits).

Transmitter 700 may further comprise a scrambler 750, a resource block (RB)-level (e.g. comprising a group of about twelve sub-carriers) repetition 760 component, and a SFBC encoder 751. The scrambler 750 may be coupled to the output of the adder 740 and may be configured to perform scrambling on the sequence of spread modulation symbols according to a selected scrambling sequence. The RB-level repetition 760 component may be coupled to the output of the scrambler 750 and configured to perform block-wise repetition on the scrambled symbol. For example, each sequence of symbols may be repeated about twice, where one sequence may be mapped to a RB located near a higher frequency edge and the other sequence may be mapped to a RB located near a lower frequency edge of a system bandwidth.

The SFBC encoder 751 may be coupled to the output of the RB-level repetition 760 component and may be substantially similar to Tx encoder 451 and/or SFBC encoder 651. Transmitter 700 may further comprise two S/P conversion 741 components coupled to the output of the SFBC encoder 751 and configured to operate on the two SFBC encoded streams, where each of the S/P conversion 741 components may be substantially similar to S/P conversion 441, 541, and/or 641 component.

The outputs at each S/P conversion 741 component may be mapped to sub-carriers for transmission via a substantially similar structure as in transmitter 400 (e.g. through a sub-carrier mapper 443, a IFFT 470 component, a P/S conversion 471 component, and an add CP 472 component for each output). However, the outputs at the S/P conversion 741 component may be mapped to two groups of sub-carriers located near the edges of the system bandwidth (e.g. a higher frequency edge and a lower frequency edge) to provide better robustness through frequency diversity.

It should be noted that transmitters 300, 400, and 500 may be suitable for generating baseband signals for UL and/or DL data channels, such as PDSCH and/or PUSCH, whereas transmitter 600 may be suitable for generating baseband signals for DL control channels, such as PBCH and/or PDCCH, and transmitter 700 may be suitable for generating baseband signals for DL control channel, such as PHICH. The different data channels and/or control channels may be time and frequency multiplexed via sub-carrier mapping (e.g. through sub-carrier mappers 343, 443, 560, and/or 643) according to some selected configurations as discussed more fully below.

In an embodiment, a wireless backhaul system (e.g. system 100) may employ carrier aggregation, where a plurality of component carriers (CC) (e.g. combinations of five, ten, and/or twenty MHz frequency bands) may be employed for transmissions. CCs may be semi-statically configured, where the CCs may be contiguous or non-contiguous, intra-band or inter-band, and each CC may or may not comprise the same bandwidth. In addition, UL CC configuration and DL CC configuration may or may not be the same. In some embodiments, a same transmitter chain (e.g. transmitter 300, 400, 500, 600, and/or 700) may be employed for generating and transmitting a signal in each CC.

When employing carrier aggregation, a HU (e.g. HU 110) may allocate one CC to one RU (e.g. RU 120) and may allocate one or more CCs to each RU. The HU may employ a substantially similar scheduling period (e.g. about five ms or about ten ms) as without carrier aggregation. In an embodiment, a primary CC may carry a PBCH for all CCs and each CC may carry a PDCCH specific to the CC. In another embodiment, a primary CC may carry a PBCH for all CCs and each CC may carry a PDCCH and a PUCCH specific to the CC. When multiple CCs are employed for communication between a HU and a RU, one of the CCs may be a serving CC that serves the RU. In some embodiments, the serving CC may provide a radio link to the RU that comprises better performance than other CCs. The serving CC may also be the CC that the RU first detected during an initial search and/or employed for initial random access. It should be noted that a HU may re-assign a different serving CC subsequently, for example, for load balancing, energy saving, changes in radio link quality, etc. In addition, the CC configurations and/or scheduling may be alternatively configured as determined by a person of ordinary skill in the art to achieve the same functionalities.

In an embodiment, a HU (e.g. HU 110) and/or a RU (RU 120) may employ substantially similar mechanisms for communicating in a UL direction and/or in a DL direction. In such embodiment, a wireless backhaul communication unit may comprise a transmitter (e.g. transmitter 300, 400, 500, 600, and/or 700) and a receiver with a substantially similar structure as in the transmitter, but may be in a reverse direction. For example, a receiver for receiving a signal generated from a single antenna transmitter, such as transmitter 300, may comprise a CP removal component, a FFT component, a sub-carrier de-mapper, a frequency domain equalizer, an IDFTcomponent, a channel de-interleaver, a de-scrambler, a Turbo decoder, a byte de-interleaver, a RS decoder, and a CRC removal component.

Figure 8:
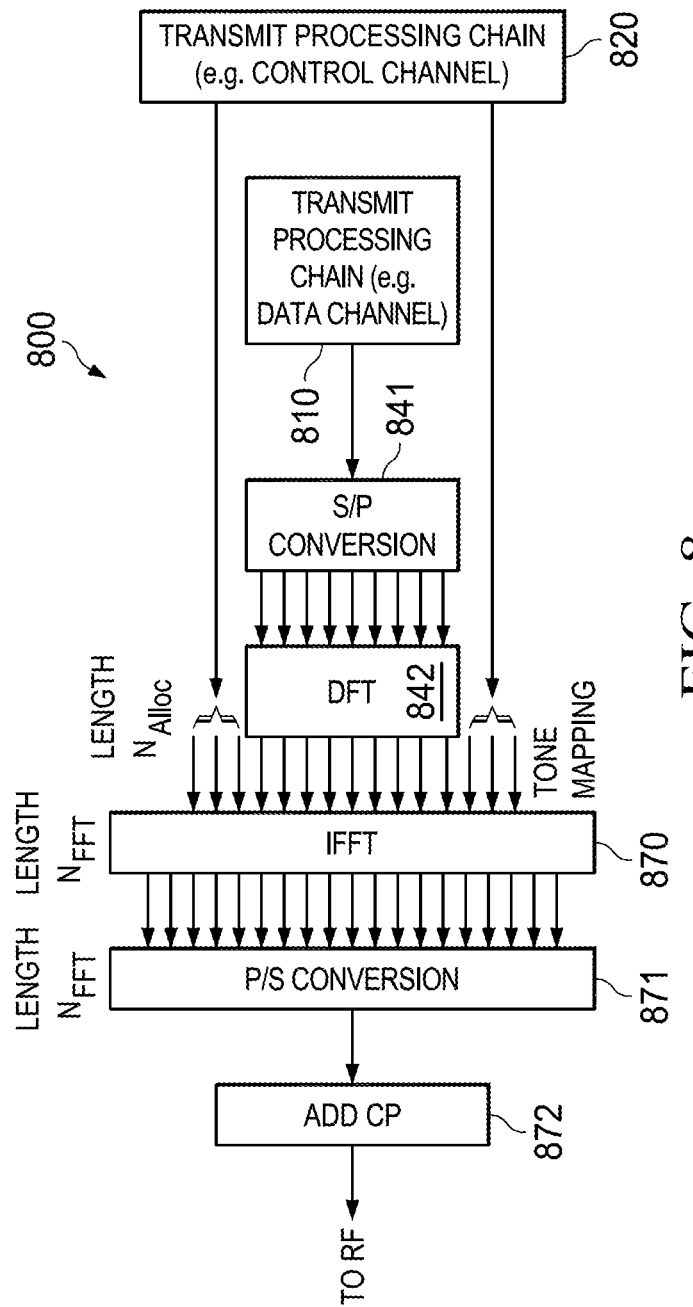
FIG. 8 shows a block diagram of a transmitter that combines SC-FDMA and OFDM transmissions in accordance with various embodiments.

FIG. 8 shows a block diagram of a transmitter 800 that combines SC-FDMA and Orthogonal Frequency Division Multiplexing (OFDM) transmissions in accordance with various embodiments. Transmitter 800 may be employed for generating baseband signals for DL transmissions at a HU (e.g. HU 110) in a wireless backhaul system (e.g. system 100). Transmitter 800 may comprises two transmit processing chains 810 and 820, an S/P conversion 841 component, a DFT 842 component, an IFFT 870 component, a P/S conversion 871 component, and an add CP 872 component. The S/P conversion 841 component, the DFT 842 component, the IFFT 870 component, the P/S conversion 871 component, and the add CP 872 component may be substantially similar to S/P conversion 341 component, DFT 342 component, IFFT 370 component, P/S conversion 371 component, and add CP 372 component.

The transmit processing chain 810 may be configured to generate a SC-FDMA baseband signal (e.g. for transporting a PDSCH) and may comprise a substantially similar bit processing (e.g. CRC, FEC, interleaver, and scrambler) and symbols processing (e.g. symbol mapper) structures as in transmitter 300.

The transmit processing chain 820 may be configured to generate an OFDM baseband signal (e.g. for transporting PHICH) and may comprise a substantially similar bit processing (e.g. bit-level repetition) and symbol processing (e.g. BPSK modulation, spreading, adder, and RB level repetition) structures as in transmitter 700.

The two transmit processing chains 810 and 820 may generate baseband signals independently and may be combined by multiplexing in a frequency domain. For example, the output of the transmit processing chain 810 may be mapped onto a set of sub-carriers located at about the middle of a system bandwidth. The output of the transmit processing chain 820 may be mapped onto another set of sub-carrier located near a higher frequency edge of the system bandwidth and near a lower frequency edge of the system bandwidth. Transmitter 800 may provide frequency diversity and a substantially low PAPR. It should be noted that transmitter 800 may also be suitable for rank-1 or rank-2 transmission by employing a structure substantially similar to transmitter 400 or 500 at transmit processing chain 810 and may re-configure and/or duplicate the S/P conversion 841 component, the DFT 842 component, the IFFT 870 component, the P/S conversion 871 component, and the add CP 872 component according to transmitters 400 and/or 500.

Figure 9:
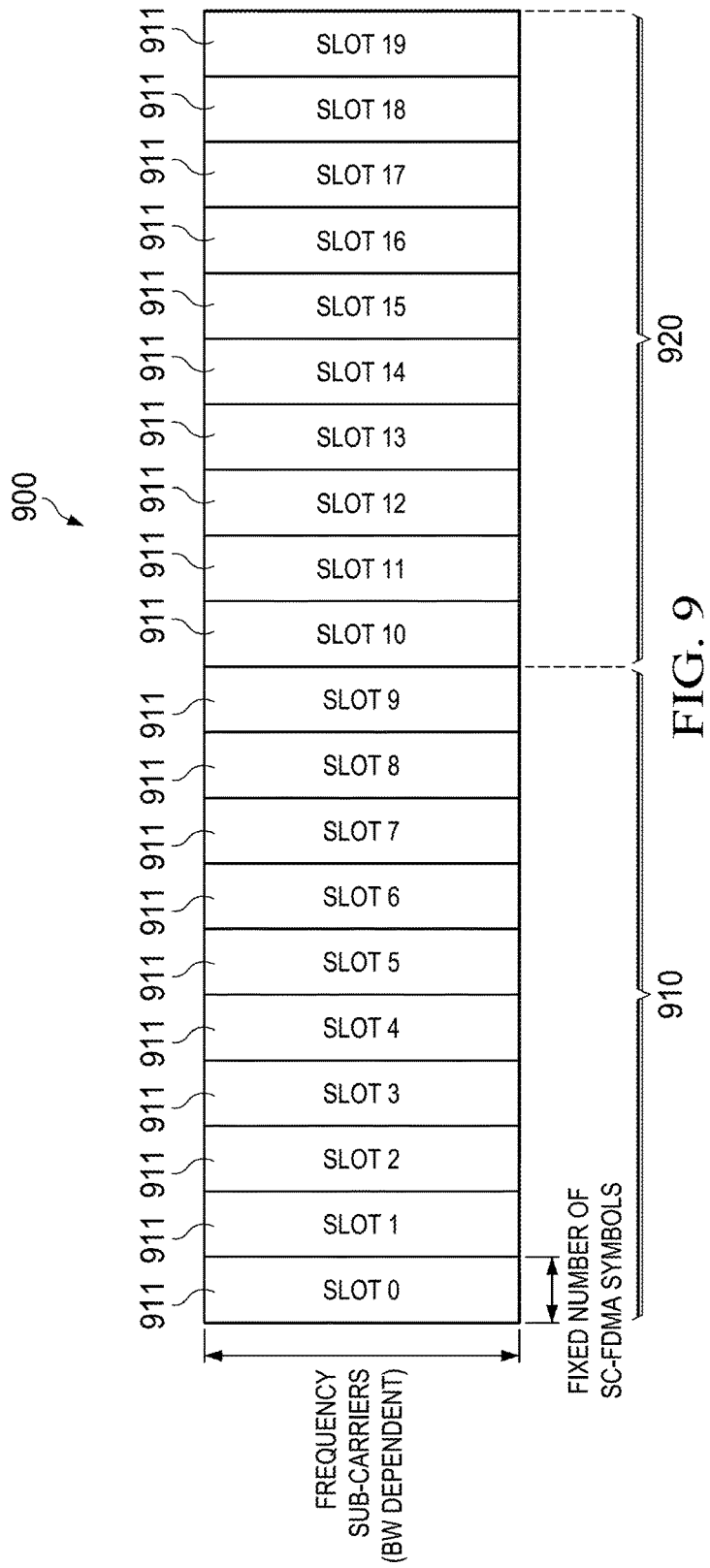
FIG. 9 shows a block diagram of a wireless backhaul radio frame in accordance with various embodiments.

FIG. 9 shows a block diagram of a wireless backhaul radio frame 900 in accordance with various embodiments. Radio frame 900 may be employed for UL communication and/or DL communication between a HU (e.g. HU 110) and a plurality of RUs (e.g. RU 120) over wireless backhaul channels (e.g. links 130) in a wireless backhaul system (e.g. system 100). For example, radio frame 900 may be divided into a first sub-frame 910 and a second sub-frame 920. The first sub-frame 910 may comprise about ten time slots 911 (e.g. time slots 0, 1, 2, 3, 4, 6, 7, 8, and 9). Similarly, the second sub-frame 920 may comprise about ten time slots 911 (e.g. time slots 10, 11, 12, 13, 14, 15, 16, 17, 18, and 19). Each time slot 911 may comprise about seven SC-FDMA symbols.

In an embodiment, each SC-FDMA symbol may comprise a plurality of sub-carriers in a system bandwidth of about five MHz, about ten MHz, or about twenty MHz (e.g. with a guard band), where each sub-carrier may comprise a spacing of about fifteen kHz. In some embodiments, the sub-carriers in a symbol may be divided into a plurality of RBs (e.g. each comprising about twelve sub-carriers, where each RB may be a minimum unit for resource allocations. For example, each SC-FDMA symbol may comprise about 1200, about 600, or about 300 sub-carriers for a system bandwidth of about twenty MHz, about ten MHz, or about five MHz, respectively. Each SC-FDMA symbol may comprise a plurality of time domain samples, where the sampling rate may be about 30.72 MHz. Each time slot 911 may comprise a time interval of about 0.5 ms. For example, each SC-FDMA symbol may comprise a time duration of about 200/3 microseconds (us) and a CP with varying lengths, for example, the first SC-FDMA symbol in each time slot may comprise a CP length of about 160 samples and subsequent SC-FDMA symbols in each time slot may comprise a CP length of about 144 samples. As such, each sub-frame 910 and/or 920 may comprise a time interval of about five ms, and thus the radio frame 900 may comprise a time interval of about ten ms. It should be noted that the time slot 911 may be referred to as a transmission time interval (TTI) and the sub-frame 910 and/or 920 may be referred to as a virtual frame (e.g. for scheduling). In an embodiment, a HU may schedule DL and/or UL transmissions for RUs in units of time slots 911 (e.g. for example at least one DL slot and at least one UL slot for each RU regardless of traffic load). In addition, the HU may schedule such that a transition between a DL transmission and a UL transmission occur at a periodicity of a virtual frame time (e.g. about five ms) or a full radio frame time (e.g. about ten ms) to provide substantially low transmission latency.

In an embodiment, a radio frame 900 may comprise a plurality of time slot types, such as a DL time slot type, a UL time slot type, and/or a special time slot type. For example, a time slot 911 of DL time slot type may carry a PDSCH, a PDCCH, and/or a PHICH and may be employed for DL communication from a HU to a RU. A time slot 911 of UL time slot type may carry a combination of PUSCH and PUCCH and may be employed for UL communication from a RU to a HU. A time slot 911 of a special time slot type may carry a PDSCH, a PBCH, a SS, a PRACH, and/or a guard period (GP) and may be employed for UL and/or DL communication between a HU and RUs. It should be noted that the GP in the special time slot may provide a silence (e.g. no UL or DL transmission) time interval to split up a DL transmission and a UL transmission such that a HU and/or a RU may switch between a transmitting mode and a receiving mode.

The time slots 911 may carry the different channels by employing a time and/or frequency multiplexing scheme as discussed more fully herein below. The time slots 911 in radio frame 900 may be generated and transmitted by employing one or more transmitters, such as transmitters 300, 400, 500, 600, 700, and/or 800. For example, transmitter 300 employing a single antenna transmission scheme may transmit about one MAC layer TB per TTI, transmitter 400 employing rank-1 transmission scheme may transmit about one MAC layer TB per TTI, and transmitter 500 employing a rank-2 transmission scheme may transmit about two MAC layer TBs per TTI.

Figure 10:
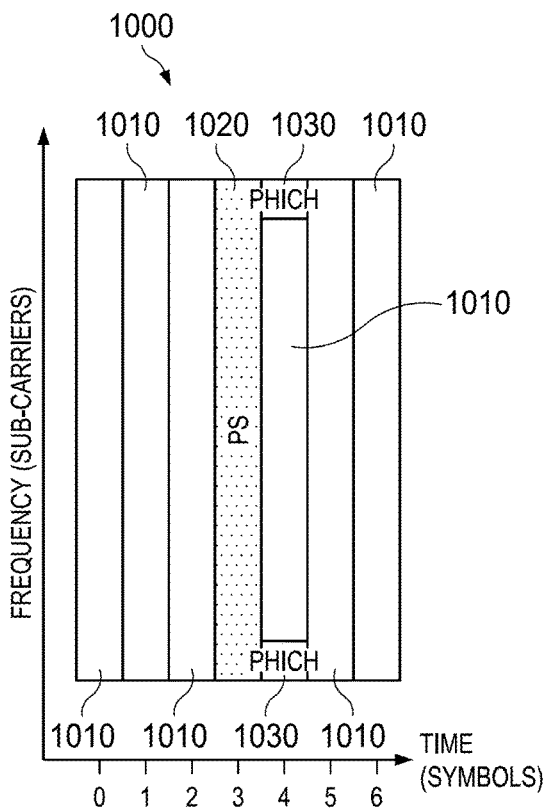
FIG. 10 shows a block diagram of a DL slot in accordance with various embodiments.

FIG. 10 shows a block diagram of a DL slot 1000 in accordance with various embodiments. The DL slot 1000 may be employed for DL communication between a HU (e.g. HU 110) and a RU (e.g. RU 120) over a wireless backhaul link (e.g. link 130) in a wireless backhaul system (e.g. system 100) and may correspond to a time slot (e.g. time slot 911) in a radio frame (e.g. radio frame 900). The DL slot 1000 may comprise a plurality of symbols (e.g. about seven symbols) in time (e.g. depicted in the x-axis) and a plurality of sub-carriers in frequency (e.g. depicted in the y-axis). The number of sub-carriers may vary depending on the system bandwidth employed between the HU and the RU. For example, the number of sub-carriers may be about 1200, about 600, or about 300 for a system bandwidth of about twenty MHz, about ten MHz, or about five MHz, respectively. The DL slot 1000 may comprise a PDSCH block 1010, a PS block 1020, and a PHICH block 1030 multiplex in frequency and in time.

In an embodiment, the PS block 1020 may be located at about symbol three in DL slot 1000 and may span all sub-carriers of symbol three. The PS block 1020 may carry a predetermined pilot sequence, such as a random Constant Amplitude Zero Auto-Correlation (CAZAC) sequence, a Zadoff-Chu sequence, or any other sequence that comprises signal properties suitable for distinguishing from other signals in the wireless backhaul links as determined by a person of ordinary skill in the art. The pilot sequence may be symbol mapped and transmitted during symbol three by a transmitter substantially similar to transmitter 300, 400, and/or 500, for example, inserting a PS generation unit located at the input to the sub-carrier mapper 343, 443, and/or 560, respectively. In some embodiments of transmitters with multiple antennas, a cyclic shifted version of the pilot sequence may be transmitted at one of the antennas. The PS block 1020 may allow a receiver at a RU (e.g. RU 120) to detect slot boundaries, estimate carrier frequency offset (CFO) and/or symbol timing, perform channel estimate, etc. It should be noted that transmit precoding and sequence hopping may not be applied to transmission of PS block 1020. It should be noted that such configuration of the PS block 1020 at about the middle of a DL slot 1000 may provide better PHY performance in a time varying channel environment since each symbol in the DL slot 1000 may comprise a smaller time difference from the PS block 1020, and thus may lead to less change and/or drift in channel estimation at a corresponding receiver.

In an embodiment, the PHICH blocks 1030 may be located at about symbol four (e.g. after PS block 1020) in time and near the two extreme edges (e.g. about 24 sub-carriers near a higher frequency edge and about 24 sub-carriers near a lower frequency edge) of the system bandwidth. The PHICH blocks 1030 may carry acknowledgements for UL data transfers (e.g. received in previous UL slots). The acknowledgements may be indicated by about one bit, which may be termed as an ACK bit when the UL data is received successfully or a NAK bit when the UL data is received unsuccessfully. Multiple acknowledgements (e.g. up to about eight ACK/NAK bits) may be carried in a same RB by employing different orthogonal cover sequences and may be referred to as a PHICH group. For example, the PHICH blocks 1030 may span about two RBs at each spectrum edge and may carry about one or two PHICH groups. The PHICH blocks 1030 may be generated and transmitted by employing a transmitter, such as transmitter 700. It should be noted that each PHICH group may be carried in two RBs, one on each frequency edge of the system frequency band (e.g. via RB-level repetition 760 component) to improve robustness via frequency diversity.

In an embodiment, the PDSCH block 1010 may be located at symbols zero, one, two, four, five, and/or six in DL slot 1000 and may span all sub-carriers except the sub-carriers carrying the PHICH blocks 1030 (e.g. via frequency multiplexing). The PDSCH block 1010 may carry DL data destined for a particular RU. The PDSCH block 1010 may be generated and transmitted by employing a transmitter, such as transmitter 300, 400, and/or 500.

Figure 11:
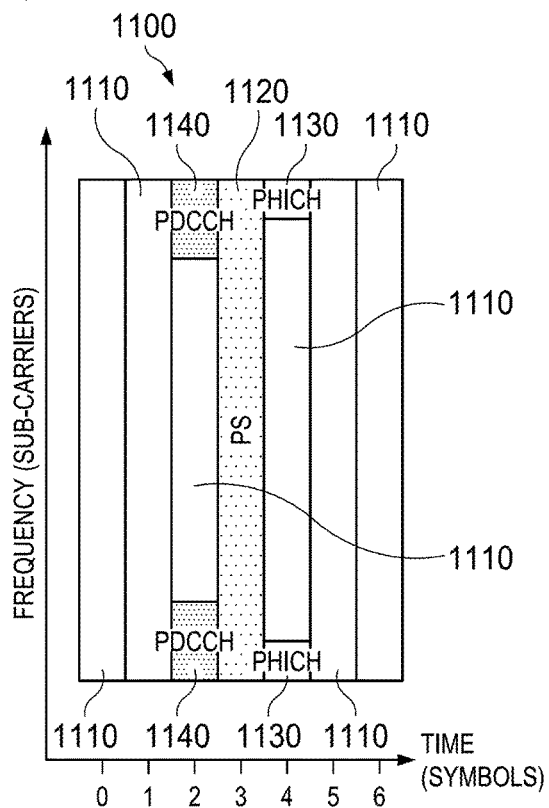
FIG. 11 shows a block diagram of another DL slot in accordance with various embodiments.

FIG. 11 shows another block diagram of a DL slot 1100 in accordance with various embodiments. The DL slot 1100 may be employed for DL communication between a HU (e.g. HU 110) and a RU (e.g. RU 120) over a wireless backhaul link (e.g. link 130) in a wireless backhaul system (e.g. system 100) and may correspond to a time slot (e.g. time slot 911) in a radio frame (e.g. radio frame 900). The DL slot 1100 may comprise a substantially similar time-frequency structure as in DL slot 1000, but may comprise different contents. For example, DL slot 1100 may comprise a PDSCH block 1110, a PS block 1120, and a PHICH block 1130, which may be substantially similar to PDSCH block 1010, PS block 1020, and PHICH blocks 1030, respectively. However, DL slot 1100 may comprise additional PDCCH blocks 1140 multiplex in time and in frequency with the PDSCH block 1110, the PS block 1120, and the PHICH blocks 1130.

In an embodiment, the PDCCH blocks 1140 may be located at about symbol two (e.g. before the PS block 1120) in time and near the two extreme edges (e.g. about 120 sub-carriers at a higher frequency edge and about 120 sub-carriers at a lower frequency edge) of the system frequency band. The PDCCH blocks 1140 may carry physical layer control information, which may be per link and may be specific to a RU. For example, DL slot 1100 may be assigned to a specific RU, where the PDCCH blocks 1140 may comprise a physical layer transmission control and/or configuration for the DL slot 1100 and/or subsequent DL slots if the RU is assigned with multiple DL slots. In addition, the PDCCH blocks 1140 may carry a physical layer transmission control and/or configuration for one or more next UL slots assigned to the RU in a scheduling period. Some examples of physical layer transmission control may include a MCS configuration, a MIMO configuration, a UL power control command, a HARQ process number (e.g. for identifying a HARQ logical channel), a HARQ redundancy version (RV) number (e.g. for identifying a re-transmission data), etc. The PDCCH blocks 1140 may be generated and transmitted by employing a transmitter, such as transmitter 600. It should be noted that the physical layer transmission control and/or configurations for the DL transmission and the UL transmission may be combined (e.g. by multiplexing and/or concatenating) before processing by the transmitter 600.

Figure 12:
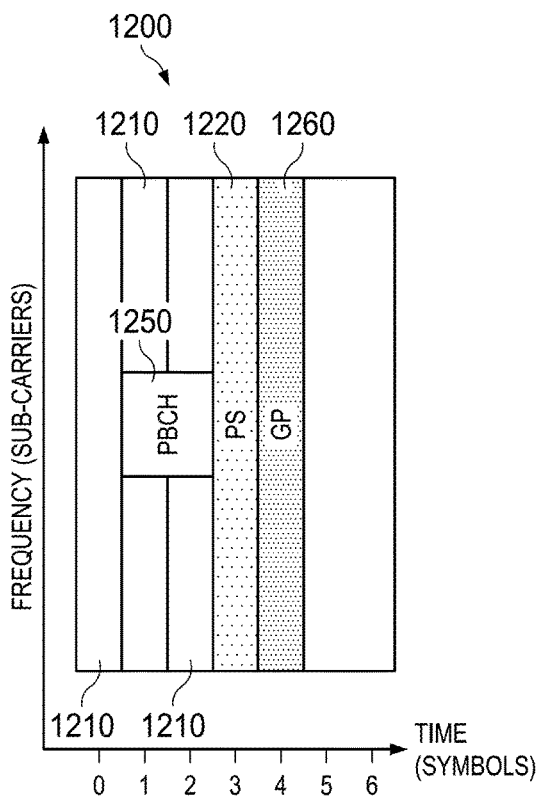
FIG. 12 shows a block diagram of a special slot in accordance with various embodiments.

FIG. 12 shows a block diagram of a special slot 1200 in accordance with various embodiments. The special slot 1200 may be employed for DL communication between a HU (e.g. HU 110) and a RU (e.g. RU 120) over a wireless backhaul link (e.g. link 130) in a wireless backhaul system (e.g. system 100) and may correspond to a time slot (e.g. time slot 911) in a radio frame (e.g. radio frame 900). The special slot 1200 may comprise a substantially similar time-frequency structure as in DL slot 1100, but may comprise different contents. For example, the special slot 1200 may comprise a PDSCH block 1210, a PS block 1220, a PBCH block 1250, and a GP block 1260 multiplex in time and in frequency. The PDSCH block 1210 and the PS block 1220 may be substantially similar to PDSCH block 1110 and PS block 1120, respectively. However, the PDSCH block 1210 may carry DL data for a RU continuing from a previous PDSCH block (e.g. PDSCH block 1010 or 1110) in a previous DL slot (e.g. slot 1000 and/or 1100). The PDSCH block 1210 may be transmitted by employing the same transmission configuration as in the previous DL slot. It should be noted that the PDSCH block 1210 may not be a standalone allocation to a RU (e.g. special slot 1200 may not carry a PDCCH block, such as PDCCH block 1140).

In an embodiment, the PBCH block 1250 may be located at about symbols one and two in special slot 1200 and may span a fixed number of sub-carriers (e.g. about 300 sub-carriers spanning a five MHz bandwidth in each symbol) centered around the direct current (DC) sub-carrier regardless of the system bandwidth. The PBCH block 1250 may carry system information, such as frame number, system bandwidth, transmission schedule, PRACH configurations and parameters, etc. The transmission schedule may include slot assignments (e.g. both UL and DL assignments) for the RUs in a next sub-frame. The PBCH block 1250 may be generated and transmitted by employing a transmitter, such as transmitter 600, and may be frequency multiplexed (e.g. via sub-carrier mapping) with PDSCH block 1210 in the same symbol.

In an embodiment, the GP block 1260 may be located at about symbol four in special slot 1200. The GP block 1260 may be a silence time interval (e.g. no UL or DL transmission) to allow transmission directions to be switched (e.g. from a DL direction to a UL direction). It should be noted that in some embodiments, RUs may be synchronized to the HU in a UL direction and may switch from a receiving mode to a transmitting mode during the time interval of the GP block 1260. It should be noted that symbols five and six may be un-allocated in special slot 1200.

Figure 13:
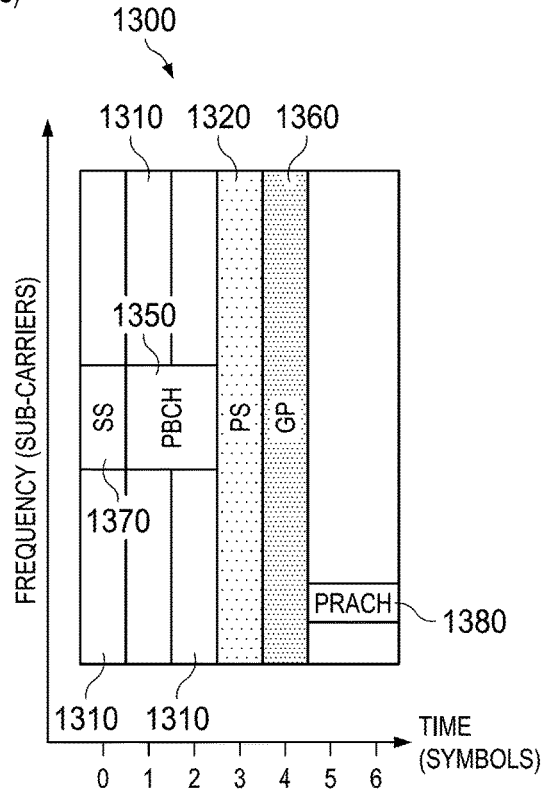
FIG. 13 shows a block diagram of another special slot in accordance with various embodiments.

FIG. 13 shows a block diagram of another special slot 1300 in accordance with various embodiments. The special slot 1300 may be employed for DL and/or UL communication between a HU (e.g. HU 110) and a RU (e.g. RU 120) over a wireless backhaul link (e.g. link 130) in a wireless backhaul system (e.g. system 100) and may correspond to a time slot (e.g. time slot 911) in a radio frame (e.g. radio frame 900). The special slot 1300 may comprise a substantially similar slot structure as in special slot 1200. However, the special slot 1300 may comprise an additional time interval for UL transmission. For example, the special slot 1300 may comprise a PDSCH block 1310, a PS block 1320, a PBCH block 1350, and a GP block 1360, which may be substantially similar to PDSCH block 1210, PS block 1220, PBCH block 1250, and GP block 1260, respectively. The special slot 1300 may further comprise a SS block 1370 and a PRACH block 1380.

In an embodiment, the SS block 1370 may be located at about symbol zero in special slot 1300 and may span a fixed number of sub-carriers (e.g. about 300 sub-carriers occupying five MHz) centered around the direct current (DC) sub-carrier regardless of the system bandwidth. The SS block 1370 may carry a predetermined synchronization sequence, such as a random CAZAC sequence or any other sequence that comprises signal properties (e.g. randomness, correlation property, etc.) suitable for distinguishing from other signals in the wireless backhaul links as determined by a person of ordinary skill in the art. In some embodiments, a wireless backhaul system may employ about seven unique CAZAC sequences for about seven different cell clusters (e.g. geographically divided areas). The synchronization sequence may be mapped to modulation symbols and transmitted during symbol zero by a transmitter substantially similar to transmitter 300, 400, and/or 500, for example, inserting a SS generation unit located at the input to the sub-carrier mapper 343, 443, and/or 560, respectively. It should be noted that the same synchronization sequence may be transmitted at each antenna when the transmitter comprises multiple antennas. In some embodiments, the SS block 1370 may be transmitted with frequency shifting (e.g. by about half a sub-carrier frequency). The SS block 1370 may allow a receiver at a RU to search for and/or synchronize to a HU during initial link setup, estimate initial CFO, etc. For example, the SS block 1370 may be transmitted about once per radio frame.

In an embodiment, the PRACH block 1380 may span about two symbols (e.g. located at about symbols five and six) in time and a plurality of sub-carriers. The PRACH block 1380 may be transmitted by a RU to a HU during initial link access. The PRACH block 1380 may carry a predetermined random preamble sequence, such as a logical root sequence, a physical root sequence, a cyclic shift sequence generated from a single root Zadoff-Chu sequence (e.g. with a length N_zc of 139 and cyclic shift N_cs of 15), or another sequence that comprises signal properties suitable for random access as determined by a person of ordinary skill in the art. In an embodiment, when the random preamble sequence is a Zadoff-Chu sequence, for example, with a length of about 139 and a cyclic shift number of about 15, such embodiment may allow nine different sequences for random access in a cell.

The random preamble sequence may be symbol mapped and transmitted during symbol three by a transmitter substantially similar to transmitter 300, 400, and/or 500, for example, by inserting a PRACH generation unit located at the input to the sub-carrier mapper 343, 443, and/or 560. In an embodiment, the PRACH block 1380 may comprise a sub-carrier spacing of about 7.5 kHz (e.g. narrower than other physical channels) and the random preamble sequence may be mapped to about six RBs and split into two frequency edges with a frequency guard band of about five sub-carriers. In an embodiment, the PRACH block 1380 may comprise a time structure comprising a sequence length of about 4096 samples, a CP length of about 448 samples, and a guard period (e.g. to accommodate timing uncertainties during initial access) length of about 288 samples. The PRACH block 1380 may allow a receiver at the HU to measure initial timing adjustment during the initial link setup. It should be noted that the generation and transmission of the PRACH block 1380 may be configured by an upper network layer (e.g. Open System Interconnection (OSI) model layers), such as a MAC layer, and the configuration parameters (e.g. random preamble sequence index, etc.) may be carried in a PBCH block (e.g. PBCH block 1350).

Figure 14A:
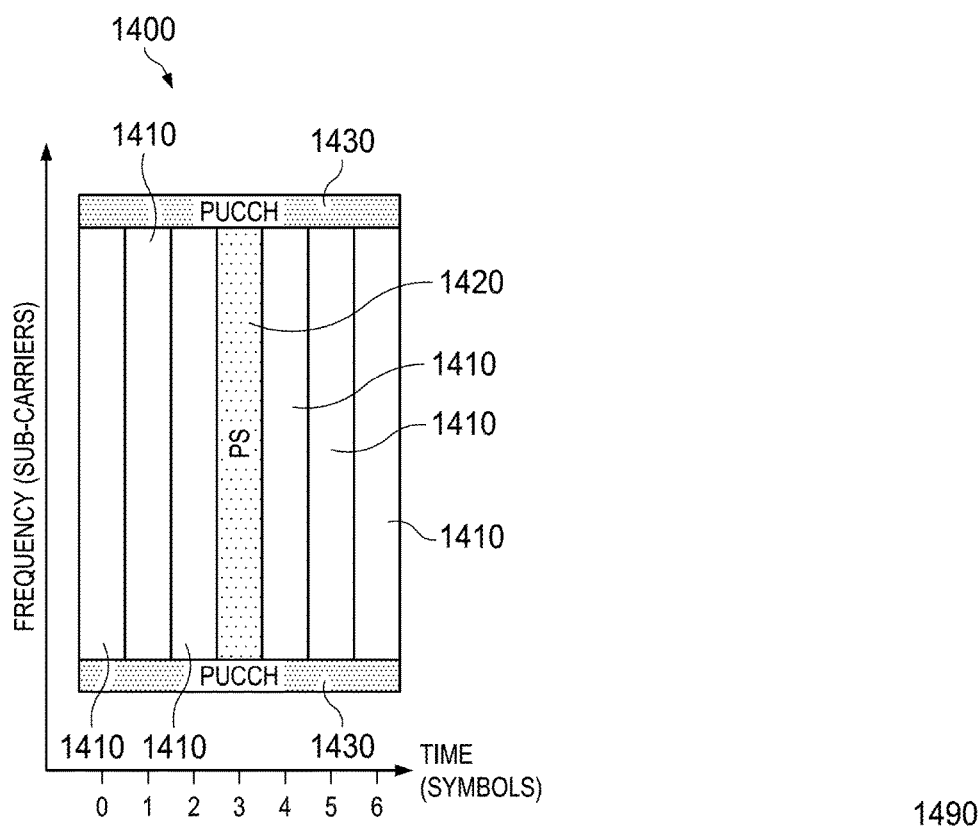
FIGS. 14A and 14B show a block diagram of a UL slot in accordance with various embodiments.

FIG. 14A shows a block diagram of a UL slot 1400 in accordance with various embodiments. The UL slot 1400 may be employed for UL communication between a HU (e.g. HU 110) and a RU (e.g. RU 120) over a wireless backhaul link (e.g. link 130) in a wireless backhaul system (e.g. system 100) and may correspond to a time slot (e.g. time slot 911) in a radio frame (e.g. radio frame 900). The UL slot 1400 may comprise a substantially similar time-frequency structure as in DL slot 1100, but may comprise different content. For example, UL slot 1400 may comprise a PUSCH block 1410, a PS block 1420, and a PUCCH block 1430 multiplex in time and in frequency. The PUSCH block 1410 and the PS block 1420 may be substantially similar to PDSCH block 1110 and PS block 1120. However, the PUSCH block 1410 may be employed for UL data transfer (e.g. from a RU to a HU) instead of DL data transfer as in PDSCH block 1110.

In an embodiment, the PUCCH block 1430 may be located at the two extreme frequency edges (e.g. a higher frequency edge and a lower frequency edge) of the system bandwidth across all symbols in UL slot 1400. The PUCCH block 1430 may carry layer l/layer 2 (e.g. OSI layers) signaling, which may include reports for ACK/NAK, CQI, RI, Scheduling Request (SR), etc. The PUCCH block 1430 may be generated and transmitted by employing a transmitter substantially similar to transmitter 300, 400, and/or 500, for example, by inserting a report generation unit at the input to the channel interleaver 325, 425, and/or 525, respectively.

Figure 14B:
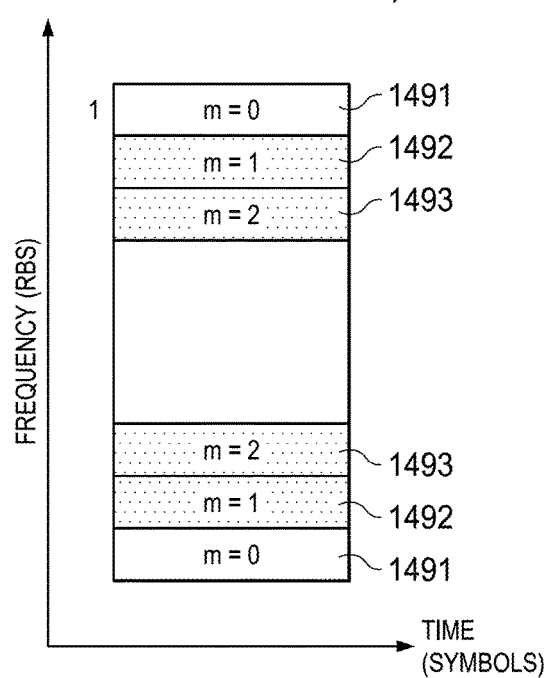

A more detailed view of the frequency mapping of the PUCCH block 1430 of the UL slot 1400 is illustrated in FIG. 14B as UL slot 1490. UL slot 1490 may comprise a substantially similar time-frequency structure as in UL slot 1400, but may represent frequencies in the y-axis in units of RBs (e.g. each comprising about twelve sub-carriers) instead of sub-carriers. UL slot 1490 may comprise a set of RBs (m=0) 1491, (m=1) 1492, and (m=2) 1493, where each set of the RBs may comprise a sub-set of RBs located near a higher frequency edge of the system bandwidth and another sub-set of RBs located near a lower frequency edge of the system bandwidth and may be symmetric about a DC sub-carrier (e.g. about same number of RBs from about the DC sub-carrier). Each set of the RBs may carry a PUCCH block 1430 generated by a different RU (e.g. RU 120). In an embodiment, a RU may be configured with an upper layer PUCCH mapping configuration parameter and may determine locations for the set of RBs from the upper layer PUCCH mapping configuration parameters.

Figure 15A:
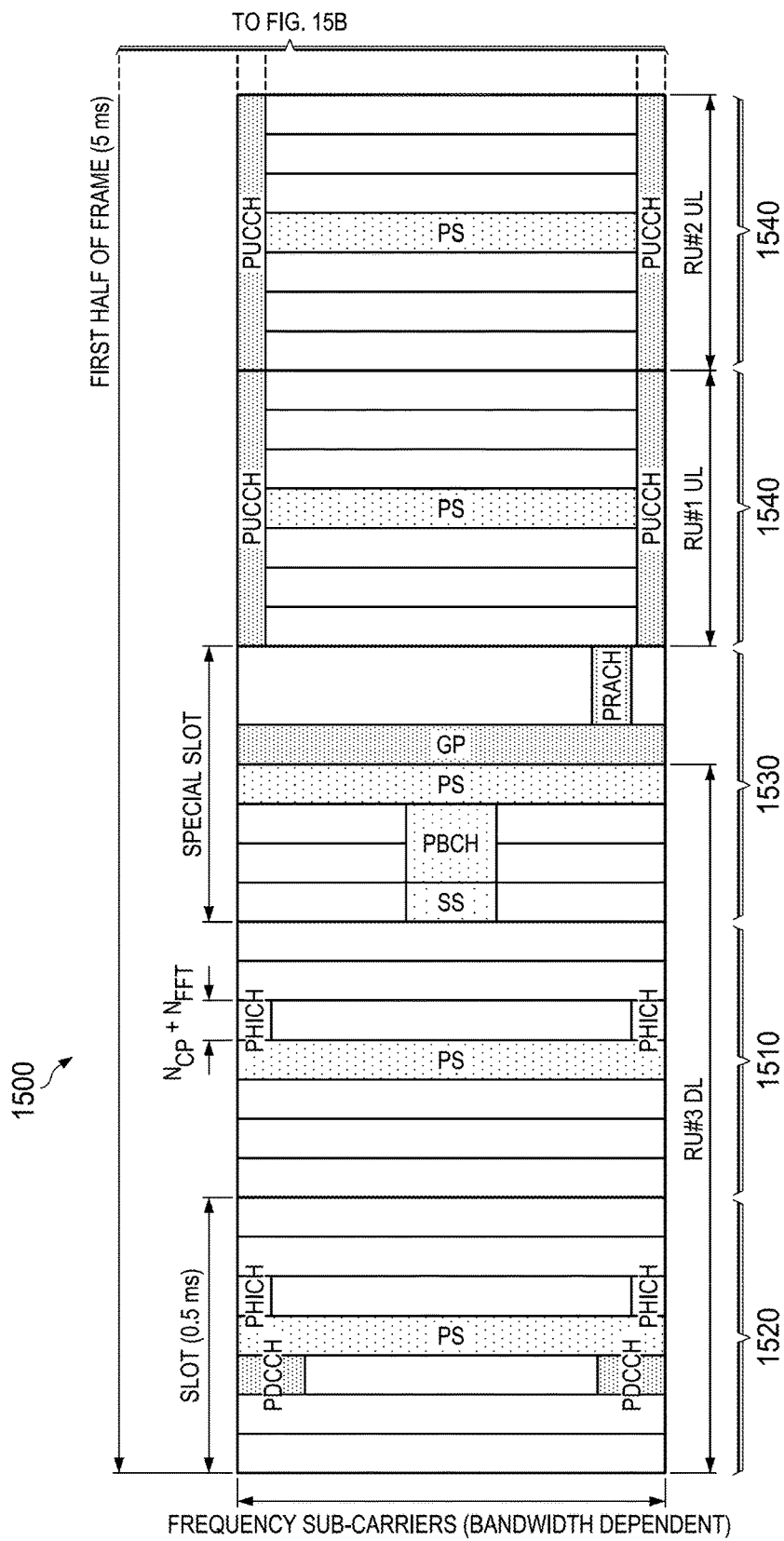
FIG. 15A/B shows a block diagram of a wireless backhaul radio sub-frame in accordance with various embodiments.
Figure 15B:
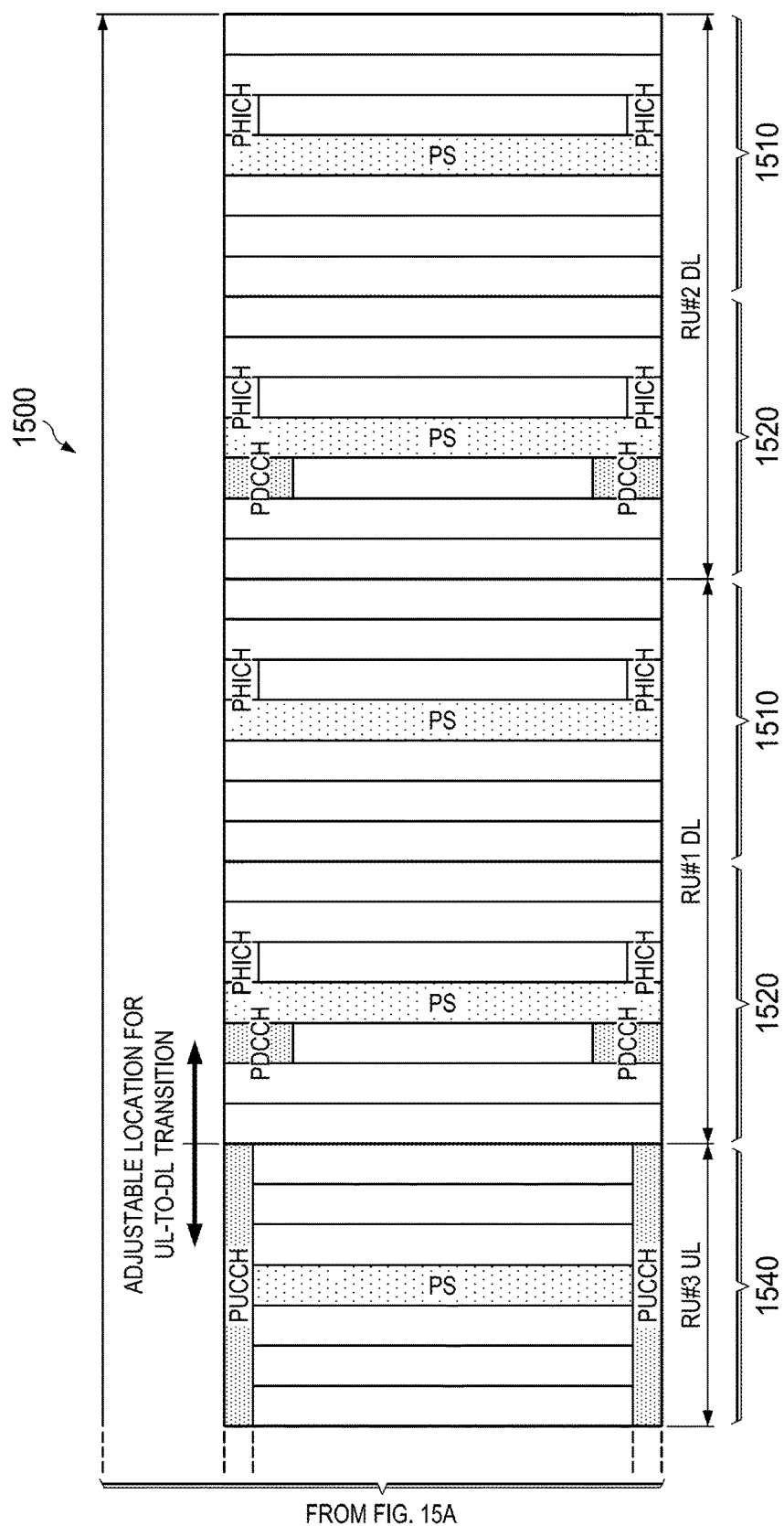

FIGS. 15A/B shows a block diagram of a wireless backhaul radio sub-frame 1500 in accordance with various embodiments. The radio sub-frame 1500 may comprise a substantially similar time-frequency structure as in radio frame 900. However, the radio sub-frame 1500 may comprise half the number of time slots 911 (e.g. about ten) in radio frame 900. The radio sub-frame 1500 may be employed for UL communication and/or DL communication between a HU (e.g. HU 110) and a plurality of RUs (e.g. RU 120) over wireless backhaul channels (e.g. links 130) in a wireless backhaul system (e.g. system 100).

The radio sub-frame 1500 may comprise a plurality of DL slots 1510 (e.g. slots 1000) and 1520 (e.g. slots 1100), a special slot 1530 (e.g. slot 1300), and a plurality of UL slots 1540 (e.g. slots 1400). As shown in FIGS. 15A/B, the radio sub-frame 1500 may be configured such that the DL slots 1510 and/or 1520 may be grouped together, the UL slots 1540 may be grouped together, and the special slot 1530 separates the DL slots 1510 and 1520 from the UL slots 1540, where a DL-UL transition may occur during a guard period in the special slot 1530 as discussed herein above. It should be noted that the boundary between a UL to DL transition may be adjustable for traffic load balancing.

Radio sub-frame 1500 may be configured such that a RU may be assigned with more than one time slot for transmitting in a DL direction, for example, a DL slot 1520 may be followed by one or more DL slots 1510. It should be noted that the first assigned slot (e.g. DL slot 1520) may carry a PDCCH (e.g. PDCCH block 1140) to indicate a physical layer transmission control employed for transmitting the first assigned slot, whereas subsequent assigned slots may not carry a PDCCH and may employ the same physical layer transmission control as the first assigned slot indicated in the PDCCH.

In an embodiment, a radio frame (e.g. radio frame 900 and/or radio sub-frame 1500) may be configured with a DL-UL switching period of about half a frame. In such a frame configuration, two special slots may be scheduled in the radio frame separated by half a frame (e.g. about ten time slots 911) as each special slot may include a GP (e.g. GP block 1260) for DL-UL transition and a PBCH for providing transmission schedules. In addition, a PRACH may be included in a radio frame, where the PRACH density may be low and may be indicated in the PBCH. As such, a radio frame may comprise one special slot without PRACH (e.g. special slot 1200) and one special slot with PRACH (e.g. special slot 1300) separated by half a frame in the radio frame. The number of DL slots and UL slots in a radio frame may be adjusted based on traffic load and the number of RUs (e.g. RU 120) in the wireless backhaul system (e.g. system 100).

In an embodiment, a radio frame (e.g. radio frame 900 and/or radio sub-frame 1500) may be configured such that each DL slots (e.g. DL slots 1000 and/or 1100), UL slots (e.g. UL slots 1400), and/or special slots (e.g. special slots 1200 and/or 1300) may comprise a PS (e.g. PS block 1020, 1120, 1320, and/or 1420) at about the first symbol of the corresponding slot to provide a low receive processing delay at a corresponding receiver. For example, the receiver may compute a channel estimate after receiving the PS at the first symbol and may employ the channel estimate for decoding subsequent symbols in the corresponding time slot. In addition, a DL slot may comprise a PDCCH block (e.g. PDCCH block 1140) and a PHICH block (e.g. PHICH block 1030 and/or 1130) located in a same symbol (e.g. at about a second symbol in the DL slot) by frequency multiplexing. For example, the PDCCH block may be mapped onto a first set of sub-carriers located near a lower frequency edge and a second set of the sub-carriers located near a higher frequency edge of a system bandwidth. Similarly, the PHICH block may be mapped to a third set of sub-carriers located near a lower frequency edge and a fourth set of sub-carriers located near a higher frequency edge of a system bandwidth. The first set of sub-carriers may be located at lower frequencies than the third set of sub-carriers and the second set of sub-carriers may be located at higher frequencies than the fourth set of sub-carriers.

Figure 16:
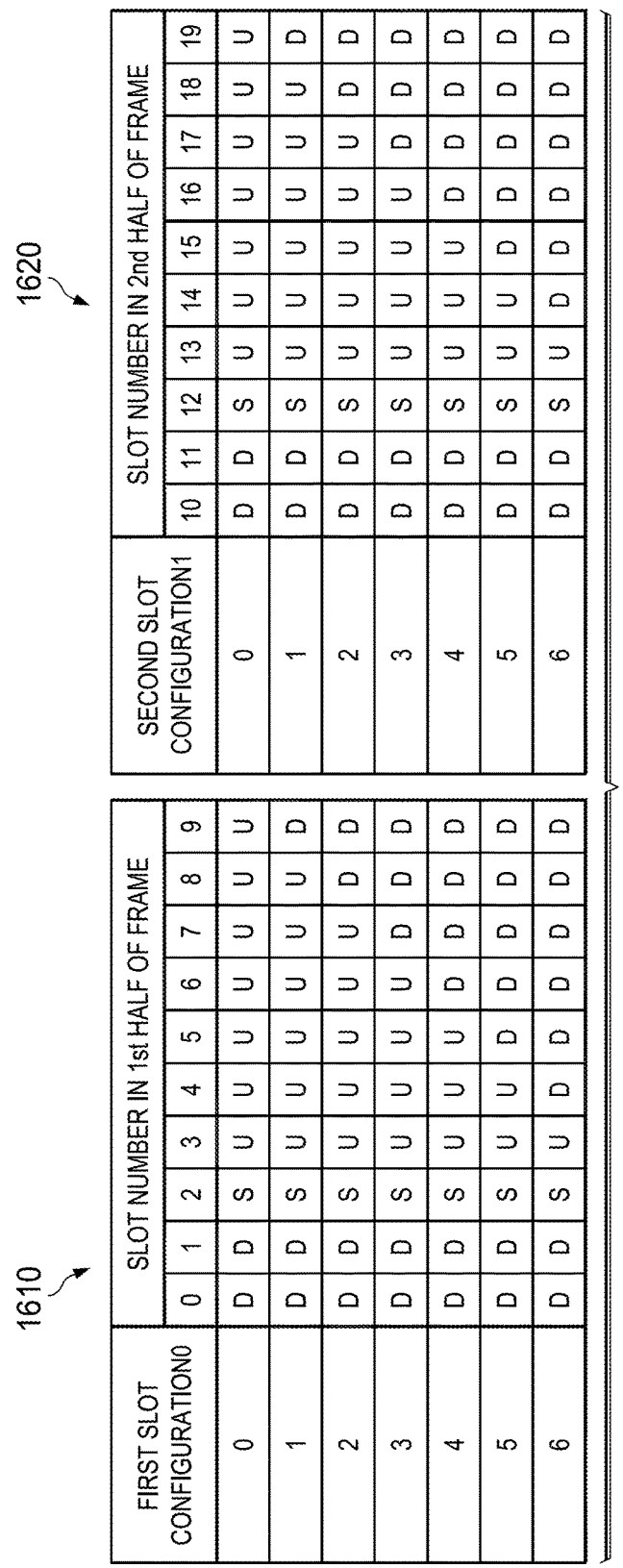
FIG. 16 shows tables of uplink-downlink (UL-DL) slot configurations in accordance with various embodiments.

FIGS. 16 and 17 illustrate an embodiment of UL-DL slot configurations for a radio frame (e.g. radio frame 900) and may denote a UL slot by U, a DL slot by D, and a special slot by S. FIG. 16 shows tables 1610 and 1620 of slot configurations in accordance with various embodiments. Table 1610 shows a plurality of first slot configurations for a first half (e.g. sub-frame 910 and/or 1500) of a ten ms radio frame (e.g. radio frame 900) and Table 1620 shows a plurality of second slot configurations for a second half (e.g. sub-frame 920 and/or 1500) of a radio frame. As shown in Tables 1610 and 1620, special slots may be located at specific slot locations that are fixed across radio frames, for example, at slot two in the first sub-frame and in slot twelve for the second sub-frame. It should be noted that switching from a DL slot to a UL slot may occur at the special slot as discussed more fully below. As such, the slot configurations shown in Tables 1610 and 1620 may provide a DL-UL switching period of about half a radio frame. A radio frame may be configured by combining a slot configuration selected from Table 1610 for a first sub-frame and a slot configuration selected from Table 1620 for a second sub-frame. However, some combinations may result in the same DL ratios and the same UL slot ratios. It should be noted that the slot configurations, the specific locations of the special slots, and/or the DL-UL switching period may be alternatively configured as determined by a person of ordinary skill in the art to achieve the same functionalities.

FIG. 17 shows a table 1700 of UL-DL slot configurations and corresponding DL ratios and UL ratios in accordance with various embodiments. For example, the slot configurations in Table 1700 are formed from selected combinations of the slot configurations from Table 1610 and Table 1620, where the DL ratios may vary from about 26 percent (%) to about 89% and the UL ratios may vary from about 74% to about 11% accordingly. It should be noted that the UL-DL slot configurations may be configured with various configurations and may be alternatively configured as determined by a person of ordinary skill in the art to achieve the same functionalities.

In an embodiment, transmission latency may be defined as the time duration from a packet being available at an Internet Protocol (IP) layer at a HU (e.g. HU 110) or a RU (e.g. RU 120) and the availability of the packet at an IP layer at a RU or a HU, respectively. Transmission latency may include a processing delay at a transmitter, TTI duration, frame alignment delay, and/or processing delay at a receiver. The processing delay at the transmitter (e.g. about 0.5 ms), the TTI duration (e.g. about 0.5 ms), and/or the processing delay at the receiver (e.g. about 1.0 ms) may be independent of slot configurations and may be substantially constant, whereas the frame alignment delay may vary depending on the slot configurations. For example, the longest DL transmission latency (e.g. about 4.05 ms) may occur when a scheduling period (e.g. about five ms) comprises only one DL slot and the longest UL transmission latency (e.g. about 4.5 ms) may occur when a scheduling period comprises only one UL slot. As such, when the scheduling period is about five ms, the transmission latency may be less than about five ms.

In an embodiment of a HARQ scheme, a HARQ feedback (e.g. ACK/NAK) for a data packet received in a time slot (e.g. slot n) may be sent in a next granted time slot that is at least about eight time slots later (e.g. slot n+8). As such, the HARQ feedback timing may vary depending on the slot configurations. For example, when the slot configuration, such as Table 1700, is employed, the HARQ feedback timing may vary between about eight to about seventeen time slots (e.g. about 4 ms to about 8.5 ms). It should be noted that retransmission rate may be substantially low when employing a FEC scheme comprising concatenated RS encoding and Turbo encoding, and thus the additional HARQ delay may be expected to occur at a substantially low rate.

Figure 18:
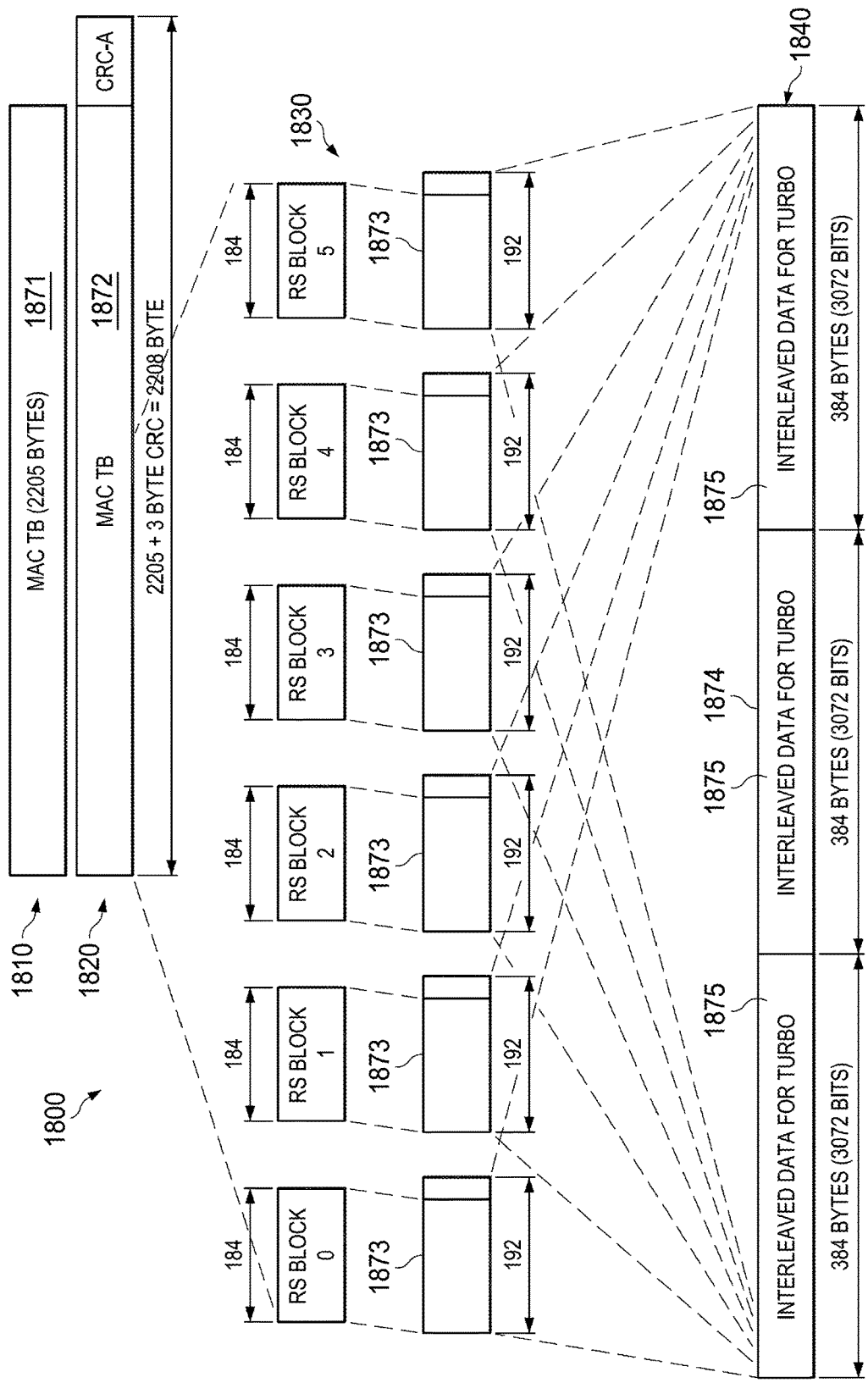
FIG. 18 shows a block diagram of a forward error correction (FEC) encoding method in accordance with various embodiments.

FIG. 18 shows a block diagram of a FEC encoding method 1800 for encoding PDSCH and/or PUSCH data in accordance with various embodiments. Method 1800 may be implemented at a transmitter (e.g. transmitter 300, 400, 500, and/or transmit processing chain 810) located at a HU (e.g. HU 110) and/or a RU (e.g. RU 120). Method 1800 may begin with receiving a MAC TB 1871 (e.g. about 2205 bytes in length) at step 1810. At step 1820, method 1800 may append a CRC (e.g. about 3 bytes in length) to the MAC TB 1871 to generate a CRC-appended TB 1872 (e.g. about 2208 bytes in length). At step 1830, method 1800 may RS encode (e.g. by employing a RS(192, 184) code at a RS encoder 321, 421, and/or 521) the CRC-appended TB 1872 into a plurality of RS codewords 1873 (e.g. about 192 bytes in length). At step 1840, method 1800 may byte interleave (e.g. by employing a byte interleaver 322, 422, and/or 522) across a group of the RS codewords 1873 (e.g. about six RS codewords) to generate an interleaved frame 1874 and may additionally segment the interleaved frame 1874 into a plurality of interleaved sub-frames 1875 (e.g. about three sub-frames of about 384 bytes length), where each sub-frame 1875 may be encoded by a Turbo encoder (e.g. Turbo encoder 323, 423, and/or 523). It should be noted that the size of the group of RS codewords for byte interleaving and the number of interleaved sub-frames may vary and may be determined according to the size of the MAC TB 1871. However, the FEC encoding may be configured such that each Turbo encoder input may comprise multiple RS codewords 1873 to provide error correction capabilities against bursty channel errors.

Figure 19:
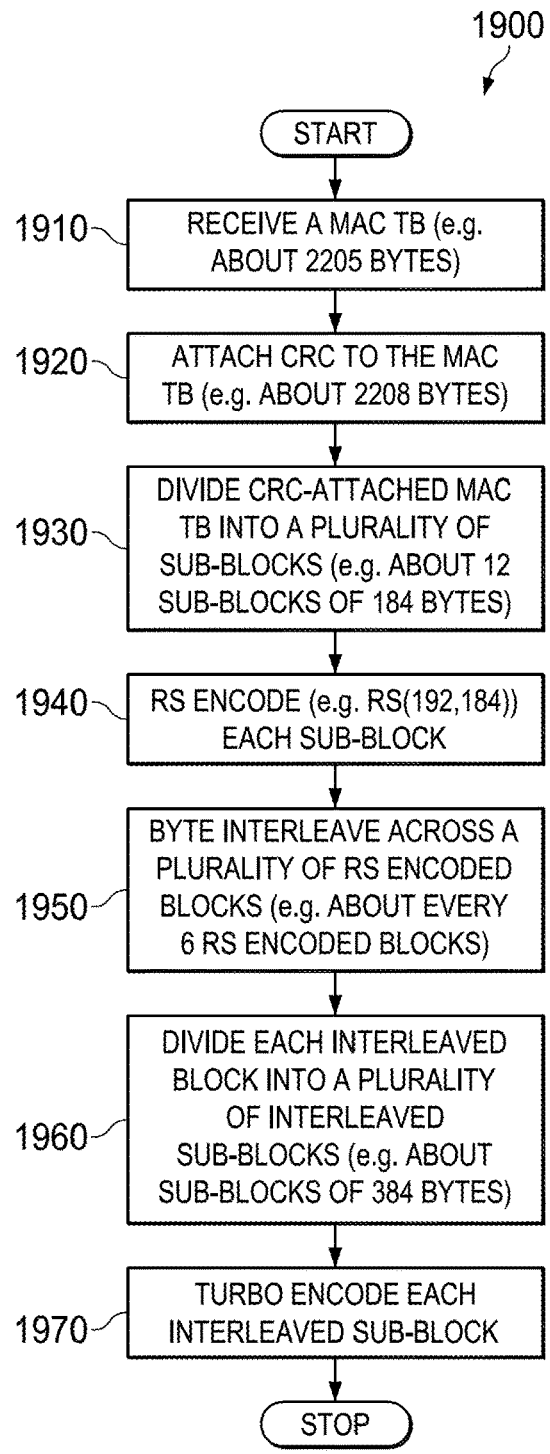
FIG. 19 shows a flowchart of a FEC encoding method in accordance with various embodiments.

FIG. 19 shows a flowchart of an FEC encoding method 1900 in accordance with various embodiments. Method 1900 may be implemented at a transmitter (e.g. transmitter 300, 400, and/or 500) located at a HU (e.g. HU 110) and/or a RU (e.g. RU 120) during FEC encoding of PDSCH and/or PUSCH data as described in method 1800. For example, method 1900 may begin with receiving a MAC TB at step 1910. For example, the MAC TB may comprise a length of about 2205 bytes. At step 1920, method 1900 may compute a CRC for the MAC TB and may append the computed CRC at the end of the MAC TB. For example, the CRC may be a CRC-24, which may comprise about three bytes. Thus, the CRC appended MAC TB may be about 2208 bytes in length. At step 1930, method 1900 may divide the CRC appended MAC TB into a plurality of sub-blocks (e.g. about twelve sub-blocks of about 184 bytes). At step 1940, method 1900 may RS encode each sub-block, for example, by employing a RS(192, 184) code, and thus may generate a RS encoded block of about 192 bytes from each sub-block. At step 1950, method 1900 may byte interleave across a plurality of the RS encode blocks (e.g. about six RS encoded blocks). For example, method 1900 may byte interleave the first six RS encoded blocks and then byte interleave the second six encoded blocks to generate about two interleaved blocks from the RS encoded blocks. At step 1960, method 1900 may divide each interleave block into a plurality of interleaved sub-blocks (e.g. about three interleaved sub-blocks of about 384 bytes). At step 1970, method 1900 may Turbo encode each interleaved sub-block.

The concatenating of RS encoding and Turbo encoding in method 1900 may provide error correction capability against bursty channel errors at a receiver. For example, a Turbo decoder at a receiver may fail to decode and correct bursty channel errors, but subsequent RS decoding at a RS decoder may correct the bursty errors. In addition, the encoding of the multiple RS codewords into multiple Turbo code blocks may provide additional error correction capability, where bursty errors may be spread across multiple RS codewords, thus improving system performance (e.g. lower BER). It should be noted that the CRC scheme, the adding of the CRC (e.g. per MAC TB block, Turbo code block, or FEC codeword), the RS code, the number of RS sub-blocks, the number of interleaving blocks, and/or the number of Turbo code blocks may be alternatively configured as determined by a person of ordinary skill in the art to achieve the same functionalities.

Figure 20:
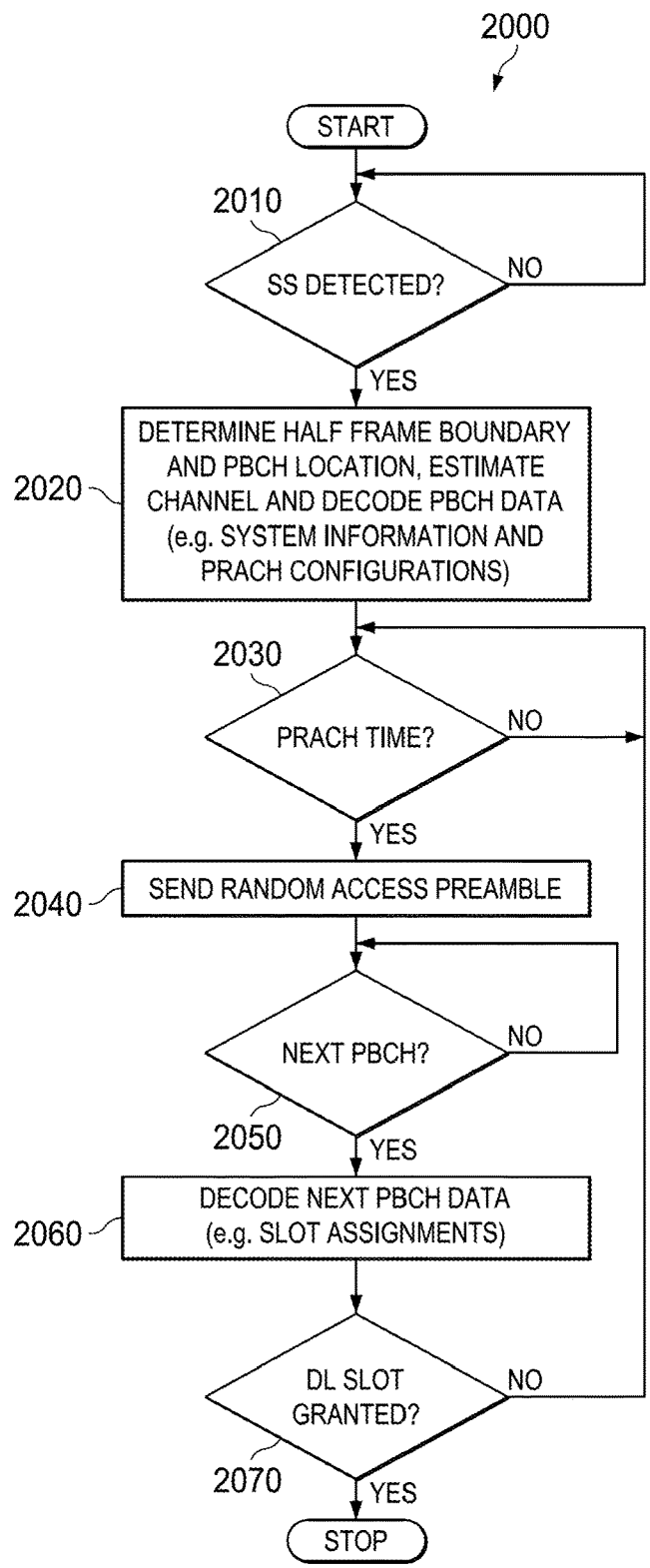
FIG. 20 shows a flowchart of an initial random access method in accordance with various embodiments.

FIG. 20 shows a flowchart of a method 2000 for initial random access in accordance with various embodiments. Method 2000 may be implemented at a RU (e.g. RU 120) during initial setup. Method 2000 may begin with detecting a SS in a received signal at step 2010. Upon detecting a SS in the received signal, method 2000 may proceed to step 2020. As described earlier, SS may be carried in a special slot (e.g. special slot 1300), which may be transmitted once per radio frame (e.g. radio frame 900 and/or 1500). In addition, a special slot may carry PBCH data and a PS. Thus, at step 2020, method 2000 may determine a half frame boundary and/or PBCH location, estimate channel from the PS, and decode the PBCH data. For example, method 2000 may determine system information and/or PRACH configuration from the PBCH data. Some examples of system information and/or PRACH configuration may include bandwidth configuration, antenna configuration, frame configuration (e.g. five ms or ten ms duration), a sub-frame number, slot configurations (e.g. UL or DL), PRACH opportunities (e.g. a PRACH time) and/or parameters (e.g. root sequence), PS root sequences, etc.

At step 2030, method 2000 may wait for the PRACH time indicated in the decoded PBCH data. When the PRACH time arrives, method 2000 may proceed to step 2040 to send a random preamble sequence according to PRACH configuration at the PRACH time. After sending the random preamble sequence, method 2000 may wait for a next PBCH at step 2050.

Upon receiving a next PBCH, method 2000 may proceed to step 2060. At step 2060, method 2000 may decode the PBCH data to retrieve slot assignments. At step 2070, method 2000 may determine whether a DL slot is granted to the RU. If a DL slot is granted, the initial random access procedure is completed and other UL timing adjustments and/or link setup procedure may be performed subsequent to the initial random access procedure. If a DL is not granted at step 2070, method 2000 may return to step 2030 to wait for a next PRACH time and repeat the random access procedure in the loop of steps 2030 to 2070. It should be noted that an unsuccessful random access may be caused by collisions.

It should be noted that the disclosed TDD radio frame configurations and baseband generation schemes may also be employed using FDMA scheduling instead of TDMA scheduling. However, TDMA scheduling may provide better system performance (e.g. lower BER) than FDMA scheduling.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
    generating a radio frame comprising a plurality of time slots, wherein each time slot comprises a plurality of sub-carriers in a system bandwidth, wherein the radio frame comprises time slots for an uplink (UL) direction and time slots for a downlink (DL) direction, wherein either a third or thirteenth time slot in the time slots for the DL direction comprises a DL time period;
    broadcasting a broadcast channel signal to a plurality of remote units in a number of consecutive sub-carriers centered about a direct current (DC) sub-carrier in at least one of the time slots in the radio frame, wherein the broadcast channel signal comprises a transmission schedule comprising slot assignments that indicate a link direction and a transmission opportunity for a first of the plurality of remote units and the broadcast channel signal is broadcasted in the DL time period; and
    transmitting a DL control channel signal and a DL data channel signal to a first remote unit over a wireless backhaul channel, wherein the DL control channel signal comprises DL control information, wherein the broadcast channel signal, the DL control channel signal, and the DL data channel signal are transmitted using a time-frequency multiplex scheme, and wherein the DL data channel signal is transmitted using a single carrier block transmission scheme comprising a Discrete Fourier Transform (DFT) spreading.

2. The method of claim 1, wherein each time slot comprises a fixed time duration, and wherein the transmission schedule comprises a scheduling period about a half radio frame time duration or a full radio frame time duration.

3. The method of claim 2, wherein the fixed time duration comprises about 0.5 milliseconds (ms) to provide low transmission latency, and wherein the radio frame comprises about twenty time slots.

4. The method of claim 1 further comprising transmitting a pilot sequence (PS) in a symbol time spanning all the sub-carriers in the system bandwidth, wherein the PS comprises a pre-determined sequence comprising signal properties that provide channel estimation capabilities in the system bandwidth.

5. The method of claim 4, wherein the PS is transmitted at a beginning of each time slot assigned for the DL direction to provide low receive processing latency at the remote units.

6. The method of claim 4, wherein the PS is transmitted at about a middle of each time slot assigned for the DL direction to provide channel estimation with low timing drift in a time-varying channel.

7. The method of claim 1, wherein the third or thirteenth time slot in the time slots for the DL direction further comprises a guard time period to provide a link direction switching opportunity and an UL time period to provide an UL random access opportunity.

8. The method of claim 1, wherein the DL time period comprises about four symbols, wherein the guard time period comprises about one symbol, and wherein the UL time period comprises about two symbols.

9. The method of claim 1 further comprising transmitting a synchronization sequence (SS) in a same set of sub-carriers as the broadcast channel signal in the DL time period of the third or thirteenth time slot in the time slots for the DL direction by time multiplexing with the broadcast channel signal, wherein the SS comprises a pre-determined sequence comprising signal properties that provide signal detection capabilities for identifying the radio frame.

10. The method of claim 9, wherein the SS sequence is transmitted in about one symbol time, and wherein the broadcast channel signal is transmitted in about two symbol time.

11. The method of claim 1, wherein the broadcast channel signal and the DL control channel signal are transmitted by employing the single carrier block transmission scheme.

12. The method of claim 1, wherein the DL control channel signal is transmitted in a first set of the sub-carriers located near a higher frequency edge of the system bandwidth and a second set of the sub-carriers located near a lower frequency edge of the system bandwidth.

13. The method of claim 1, wherein the slot assignments comprise a slot assignment for the first remote unit for UL transmission, wherein the DL control channel signal further comprises UL control information for the UL transmission, and wherein the method further comprises:
    combining at least some of the DL control information and at least some of the UL control information to generate a control frame; and
    computing a Cyclic Redundancy Check (CRC) for the control frame.

14. The method of claim 1 further comprising:
    receiving a UL data channel signal comprising a UL data frame from the first remote unit;
    generating a hybrid automatic repeat request (HARQ) feedback signal according to a reception status of the UL data frame;
    mapping the HARQ feedback signal to a first set of the sub-carriers located near a higher frequency edge of the system bandwidth; and
    repeating the mapping of the HARQ feedback signal to a second set of the sub-carriers located near a lower frequency edge of the system bandwidth.

15. An apparatus comprising:
    a transceiver; and
    a processing unit coupled to the transceiver, the processing unit is configured to:
        generate a radio frame comprising time slots for an uplink (UL) direction and time slots for a downlink (DL) direction, wherein each time slot comprises a plurality of sub-carriers in a system bandwidth and wherein either a third or thirteenth time slot in the time slots for the DL direction comprises a DL time period,
        broadcast a broadcast channel signal to a plurality of remote units over a wireless backhaul channel in a number of consecutive sub-carriers centered about a direct current (DC) sub-carrier in at least one of the time slots in the radio frame, wherein the broadcast channel signal comprises a transmission schedule comprising slot assignments that indicate a link direction and a transmission opportunity for a first of the plurality of remote units and the broadcast channel signal is broadcasted in the DL time period; and transmit a DL control channel signal and a DL data channel signal to a first remote unit over a wireless backhaul channel, wherein the DL control channel signal comprises DL control information, wherein the broadcast channel signal, the DL control channel signal, and the DL data channel signal are transmitted using a time-frequency multiplex scheme, and wherein the DL data channel signal is transmitted using a single carrier block transmission scheme comprising a Discrete Fourier Transform (DFT) spreading.

16. The apparatus of claim 15, wherein each time slot comprises a fixed time duration, and wherein the transmission schedule comprises a scheduling period about a half radio frame time duration or a full radio frame time duration.

17. The apparatus of claim 16, wherein the fixed time duration comprises about 0.5 milliseconds (ms) to provide low transmission latency, and wherein the radio frame comprises about twenty time slots.

18. The apparatus of claim 15, wherein the third or thirteenth time slot in the time slots for the DL direction further comprising a guard time period to provide a link direction switching opportunity, and an UL time period to provide an UL random access opportunity, and wherein the broadcast channel signal is broadcasted in the DL time period of the third or thirteenth time slot in the time slots for the DL direction.

19. The apparatus of claim 15, wherein the processing unit is further configured to transmit a synchronization sequence (SS) in a same set of sub-carriers as the broadcast channel signal in the DL time period of the third or thirteenth time slot in the time slots for the DL direction by time multiplexing with the broadcast channel signal, wherein the SS comprises a pre-determined sequence comprising signal properties that provide signal detection capabilities for identifying the radio frame.

20. The apparatus of claim 19, wherein the SS sequence is transmitted in about one symbol time, and wherein the broadcast channel signal is transmitted in about two symbol time.

21. The apparatus of claim 15, wherein the broadcast channel signal and the DL control channel signal are transmitted by employing the single carrier block transmission scheme.

22. The apparatus of claim 15, wherein the DL control channel signal is transmitted in a first set of the sub-carriers located near a higher frequency edge of the system bandwidth and a second set of the sub-carriers located near a lower frequency edge of the system bandwidth.

23. The apparatus of claim 15, the processing unit is further configured to:
  combine at least some of the DL control information and at least some of the UL control information to generate a control frame; and
  compute a Cyclic Redundancy Check (CRC) for the control frame.

24. The apparatus of claim 15, wherein the processing unit is further configured to:
  receive a UL data channel signal comprising a UL data frame from the first remote unit;
  generate a hybrid automatic repeat request (HARQ) feedback signal according to a reception status of the UL data frame;
  map the HARQ feedback signal to a first set of the sub-carriers located near a higher frequency edge of the system bandwidth; and
  repeat the mapping of the HARQ feedback signal to a second set of the sub-carriers located near a lower frequency edge of the system bandwidth.

* * * * *